United States Patent
Okutani et al.

(10) Patent No.: US 9,852,914 B2
(45) Date of Patent: Dec. 26, 2017

(54) SACRIFICIAL-FILM REMOVAL METHOD AND SUBSTRATE PROCESSING DEVICE

(71) Applicants: SCREEN Holdings Co., Ltd., Kyoto (JP); CENTRAL GLASS COMPANY, LIMITED, Yamaguchi (JP)

(72) Inventors: Manabu Okutani, Kyoto (JP); Tomonori Umezaki, Yamaguchi (JP); Akiou Kikuchi, Yamaguchi (JP)

(73) Assignees: SCREEN Holdings Co., Ltd. (JP); CENTRAL GLASS COMPANY, LIMITED (JP)

( * ) Notice: Subject to any disclaimer, the term of this patent is extended or adjusted under 35 U.S.C. 154(b) by 0 days.

(21) Appl. No.: 15/032,516

(22) PCT Filed: Oct. 27, 2014

(86) PCT No.: PCT/JP2014/078529
§ 371 (c)(1),
(2) Date: Apr. 27, 2016

(87) PCT Pub. No.: WO2015/064546
PCT Pub. Date: May 7, 2015

(65) Prior Publication Data
US 2016/0254162 A1  Sep. 1, 2016

(30) Foreign Application Priority Data
Oct. 30, 2013 (JP) .................................. 2013-225859

(51) Int. Cl.
*H01L 21/02* (2006.01)
*H01L 21/306* (2006.01)
(Continued)

(52) U.S. Cl.
CPC .... *H01L 21/30604* (2013.01); *H01L 21/0206* (2013.01); *H01L 21/02057* (2013.01);
(Continued)

(58) Field of Classification Search
None
See application file for complete search history.

(56) References Cited

U.S. PATENT DOCUMENTS 5,314,572 A * 5/1994 Core .................... B81C 1/0092
216/17
7,208,095 B2 * 4/2007 Kundalgurki ..... H01L 21/02068
216/13
(Continued)

FOREIGN PATENT DOCUMENTS

JP  2007-019161  1/2007
JP  2008-028365  2/2008
(Continued)

OTHER PUBLICATIONS

International Search Report dated Jan. 27, 2015 in corresponding PCT International Application No. PCT/JP2014/078529.
(Continued)

*Primary Examiner* — Shamim Ahmed
(74) *Attorney, Agent, or Firm* — Ostrolenk Faber LLP

(57) ABSTRACT

The present invention is a sacrificial-film removal method of removing a sacrificial film from a surface of a substrate provided with a plurality of struts and the sacrificial film embedded between the plurality of struts, including: a wet etching step where the sacrificial film is removed to its halfway depth by supplying an etchant to the surface of the substrate; a rinse step where a residue adhering to the surface of the substrate is washed out by supplying a rinsing liquid to the surface of the substrate after the wet etching step; a drying step where a liquid component on the surface of the substrate is removed after the rinse step; and a dry etching step where the sacrificial film remaining on the surface of the substrate is removed by supplying an etching gas to the surface of the substrate after the drying step.

4 Claims, 18 Drawing Sheets

(51) Int. Cl.
*H01L 21/3065* (2006.01)
*H01L 21/3213* (2006.01)
*H01L 21/67* (2006.01)

(52) U.S. Cl.
CPC .... *H01L 21/3065* (2013.01); *H01L 21/32134* (2013.01); *H01L 21/32135* (2013.01); *H01L 21/67028* (2013.01)

(56) References Cited

U.S. PATENT DOCUMENTS

| | | | |
|---|---|---|---|
| 2005/0104110 A1 | 5/2005 | Yeo et al. .................... 257/306 |
| 2005/0191856 A1* | 9/2005 | Torek ................ H01L 21/31111 438/689 |
| 2007/0009839 A1 | 1/2007 | Harumoto .................... 430/313 |
| 2008/0078426 A1 | 4/2008 | Miya et al. .................... 134/30 |
| 2008/0188056 A1* | 8/2008 | Kim ................ H01L 27/10852 438/386 |
| 2010/0055915 A1 | 3/2010 | Kanegae et al. ............. 438/704 |
| 2010/0072169 A1* | 3/2010 | DeYoung .......... H01L 21/02068 216/13 |
| 2011/0159660 A1 | 6/2011 | Kang et al. .................. 438/381 |
| 2012/0045581 A1 | 2/2012 | Kimura et al. ............ 427/248.1 |
| 2013/0014785 A1 | 1/2013 | Kimura et al. ................. 134/31 |
| 2013/0134528 A1 | 5/2013 | Nguyen et al. ............... 257/415 |

FOREIGN PATENT DOCUMENTS

| | | |
|---|---|---|
| JP | 2008-166513 | 7/2008 |
| JP | 2013-021208 | 1/2013 |
| JP | 2013-102238 | 5/2013 |
| KR | 10-2005-0055077 | 6/2005 |
| KR | 10-2011-0082901 | 7/2011 |

OTHER PUBLICATIONS

Written Opinion dated Jan. 27, 2015 in corresponding PCT International Application No. PCT/JP2014/078529.
Notification Concerning Transmittal of International Preliminary Report on Patentability (Chapter 1) dated May 12, 2016 with a Notification from the International Bureau Form PCT/IB/326.
English translation of Notification of Transmittal of Translation of the International Preliminary Report on Patentability dated May 12, 2016 with a Notification from the International Bureau Form PCT/IB/338.

* cited by examiner

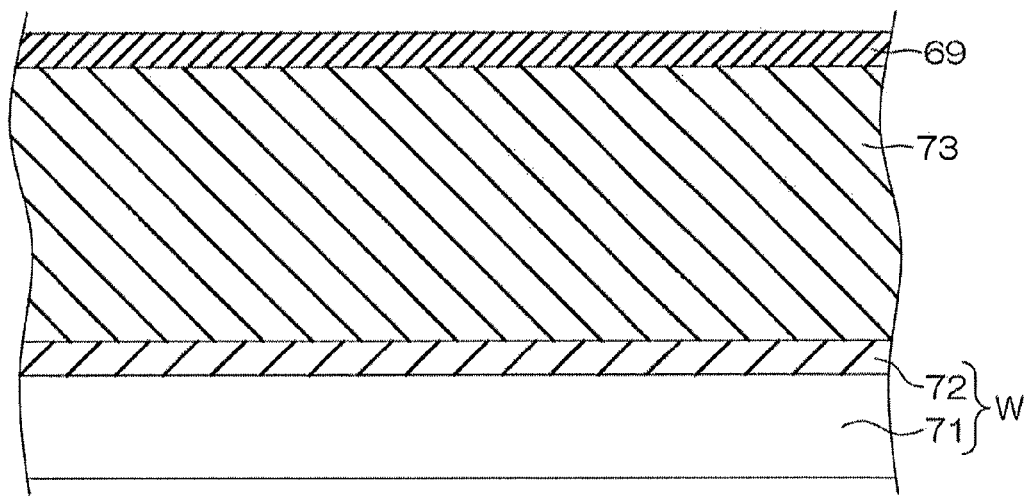
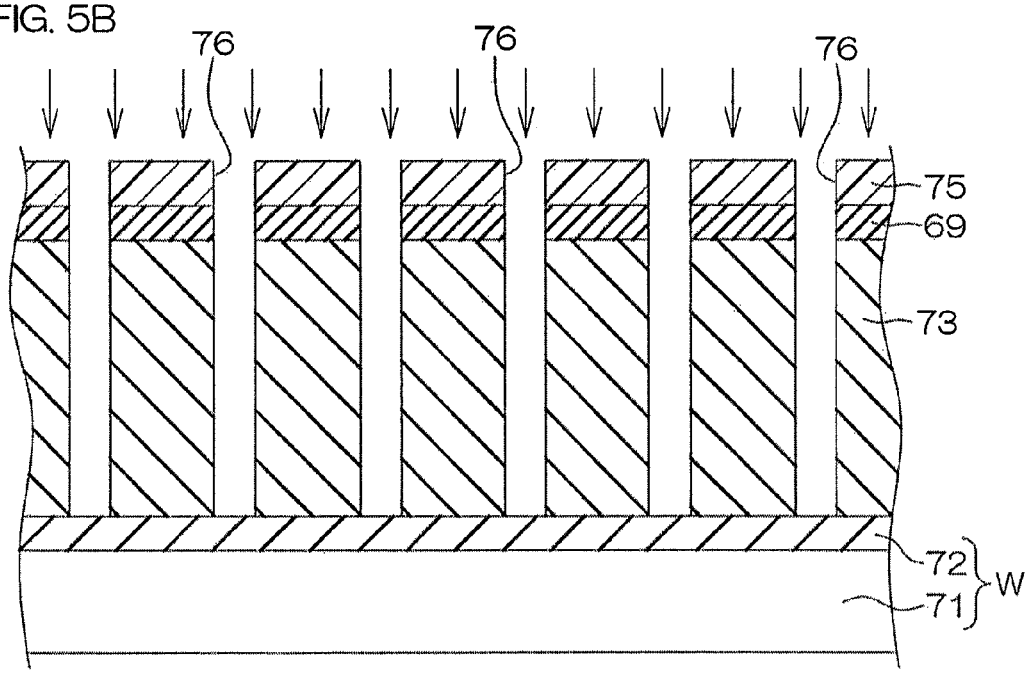

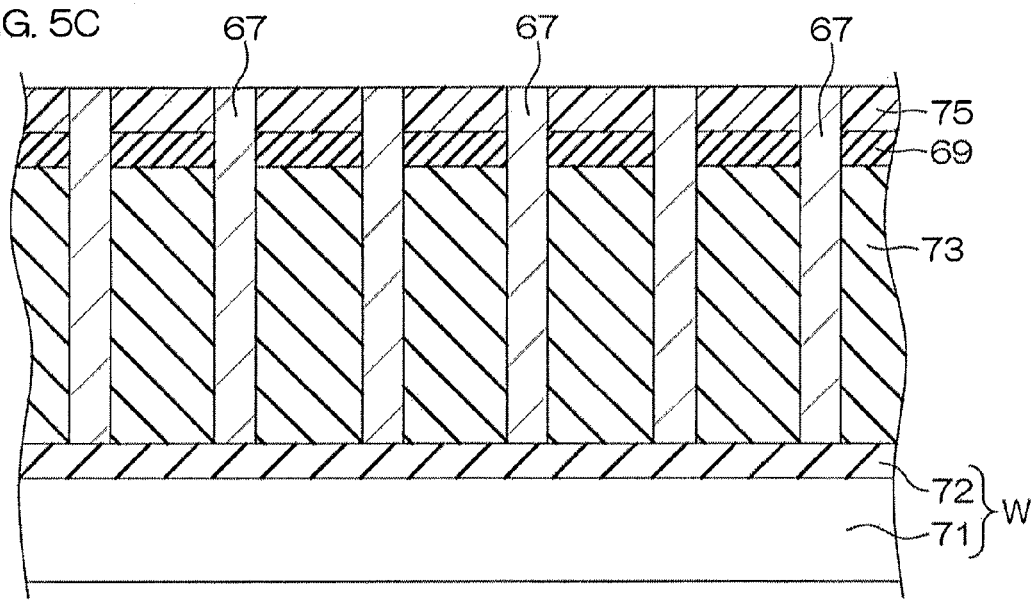
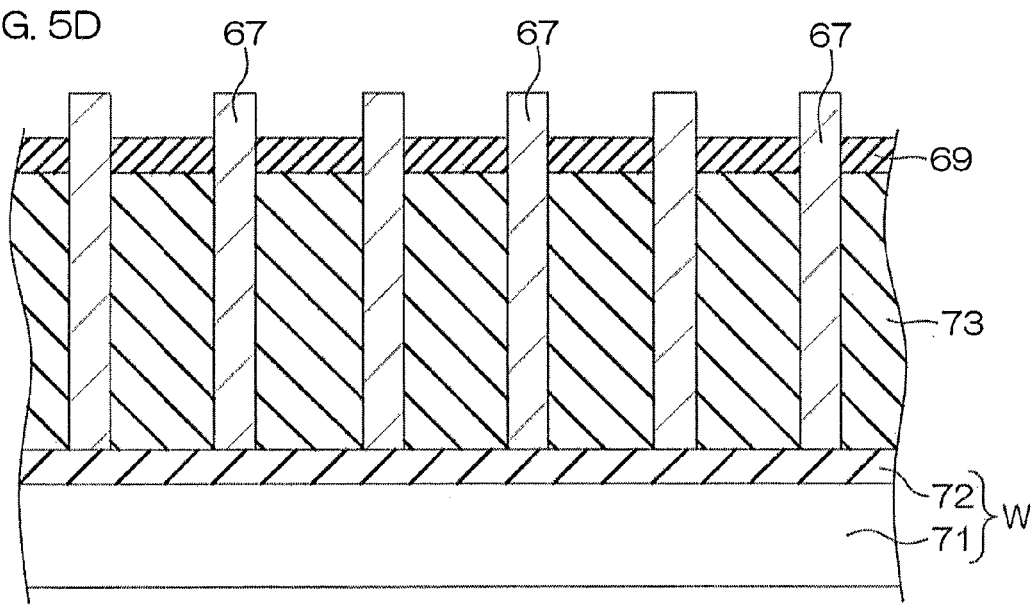

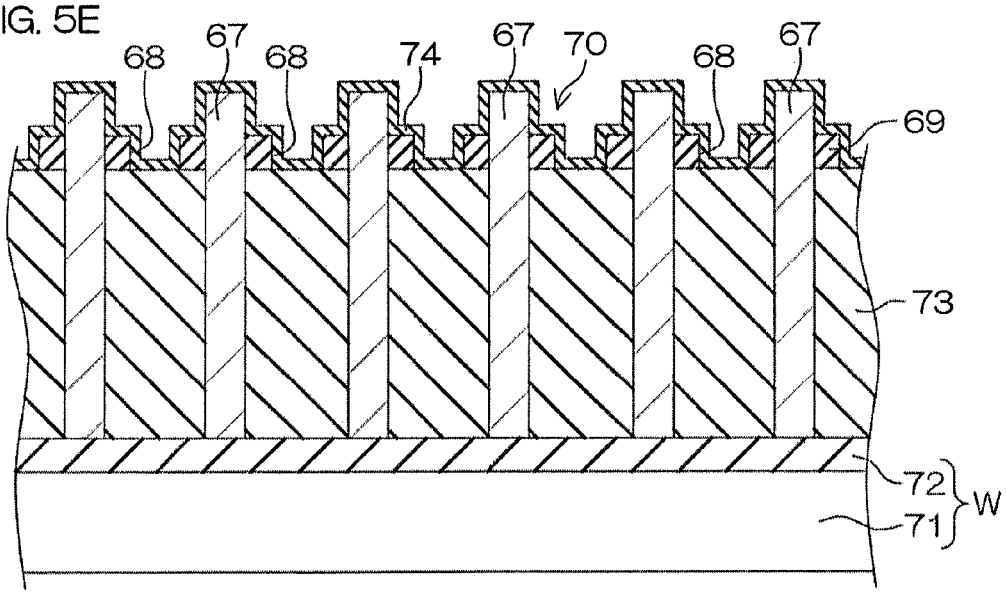

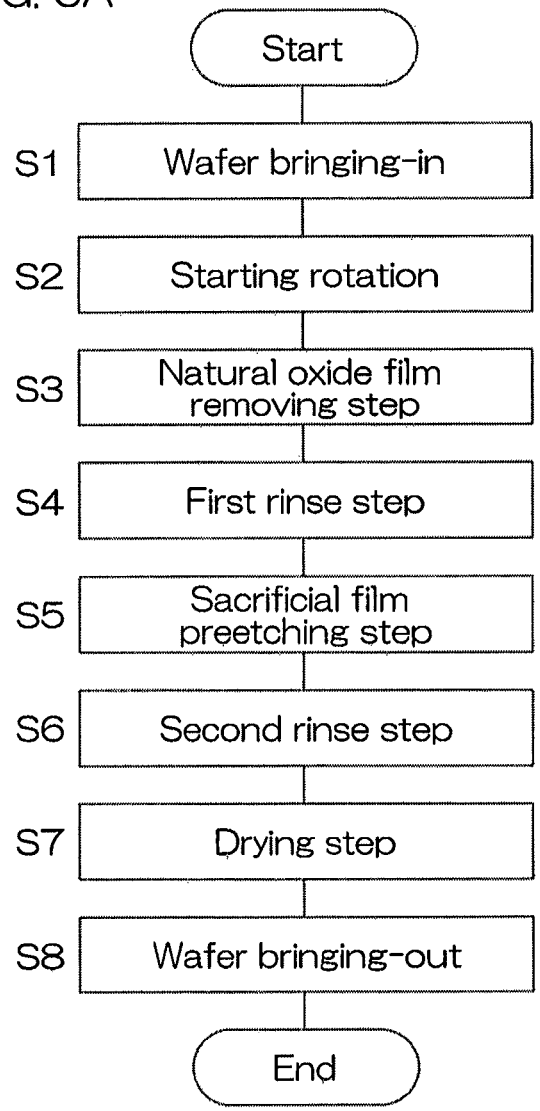

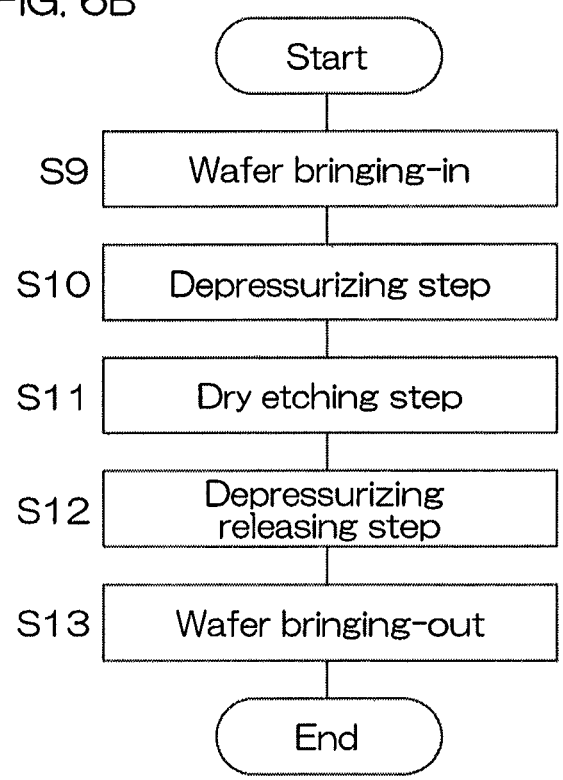

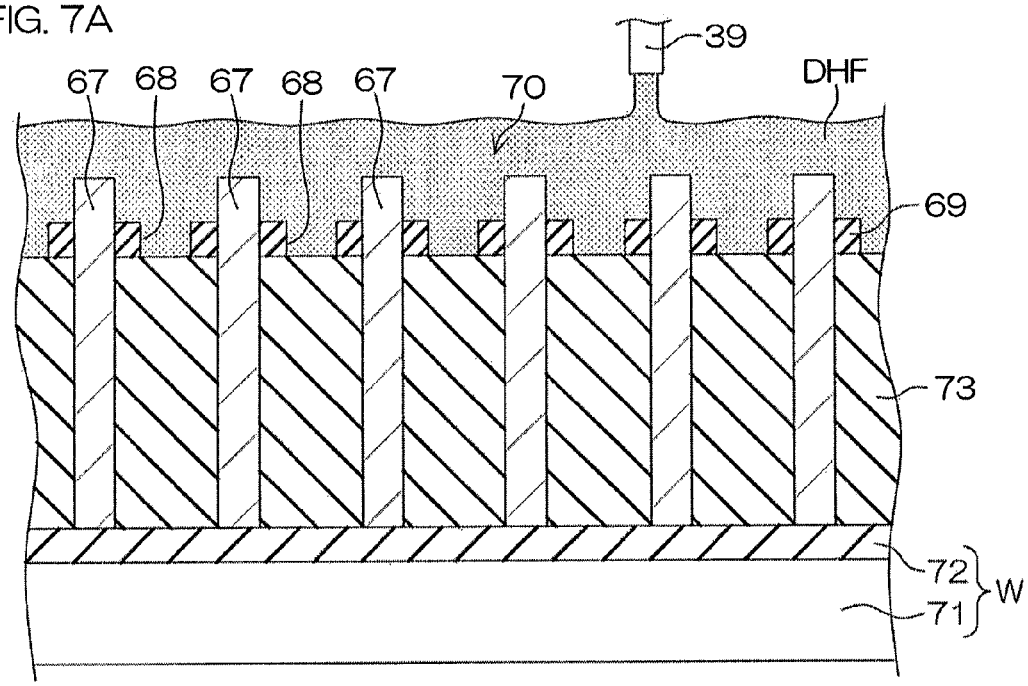
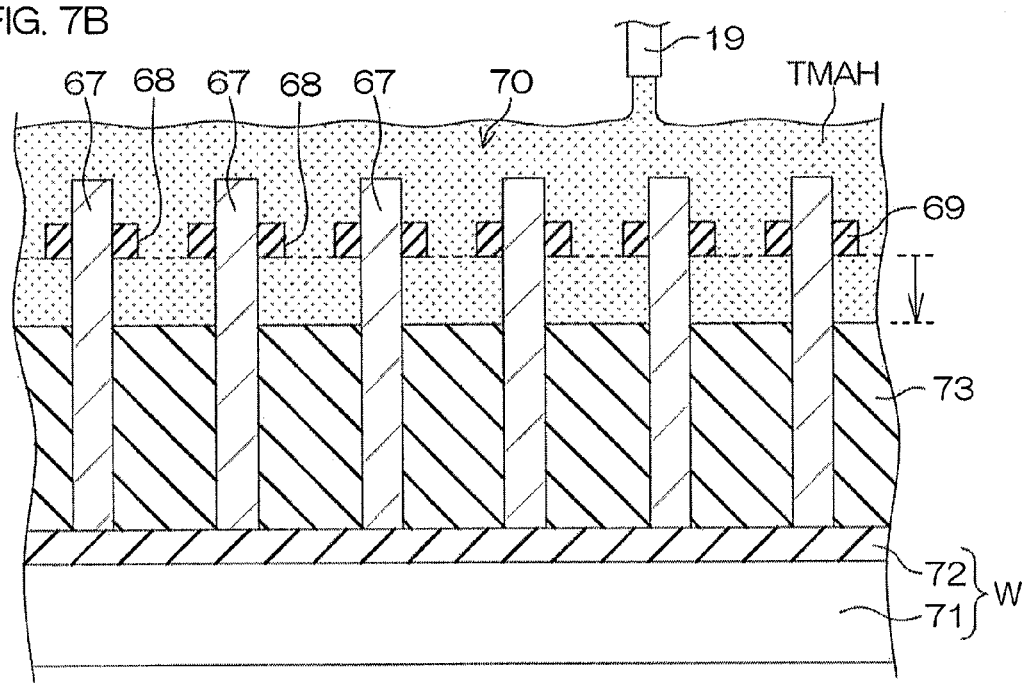

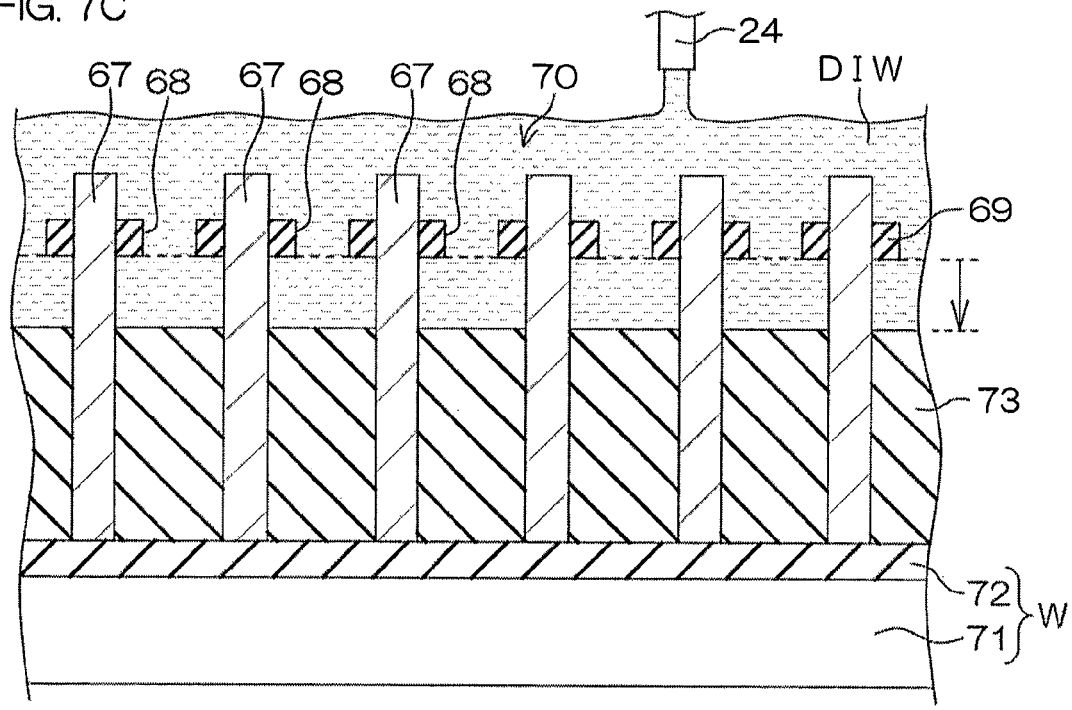
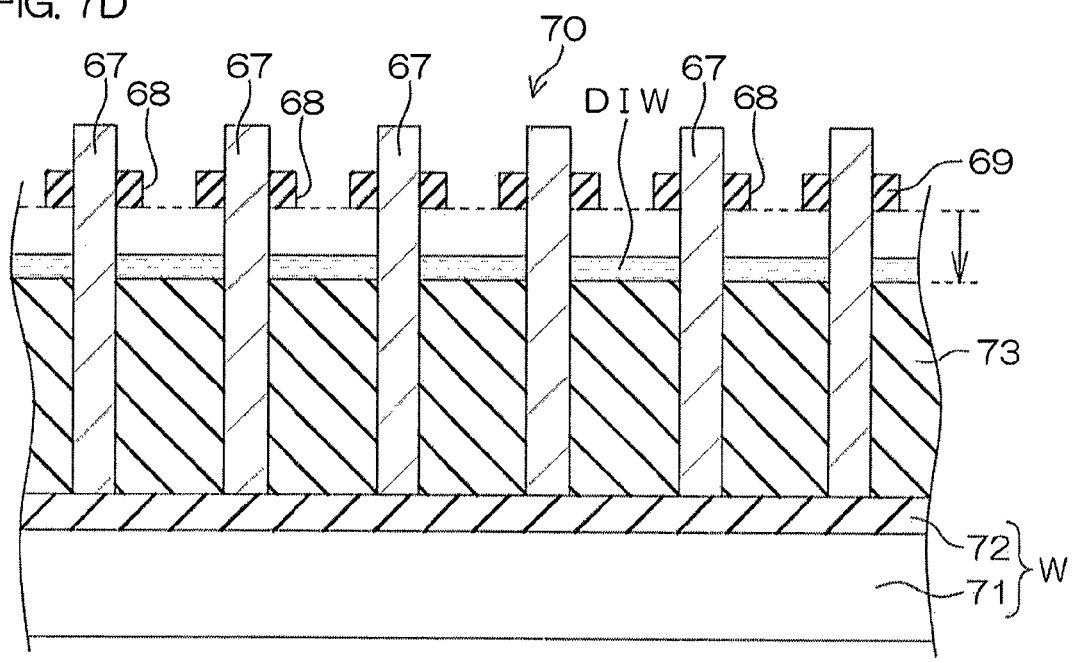

|  | Aspect ratio (AR) |
|---|---|
| at time of DIW | 8 |
| at time of IPA | 15 |

SACRIFICIAL-FILM REMOVAL METHOD AND SUBSTRATE PROCESSING DEVICE

CROSS-REFERENCE TO RELATED APPLICATIONS

The present application is a 35 U.S.C. §§371 national phase conversion of PCT/JP2014/078529, filed Oct. 27, 2014, which claims priority to Japanese Patent Application No. 2013-225859, filed Oct. 30, 2013, the contents of both of which are incorporated herein by reference. The PCT International Application was published in the Japanese language.

FIELD OF THE INVENTION

The present invention relates to a sacrificial-film removal method for removing a sacrificial film formed on a surface of a substrate such as a semiconductor substrate and a substrate processing apparatus for performing an etching treatment to a substrate whose surface is provided with a sacrificial film.

BACKGROUND ART

In a production process of a semiconductor substrate, in order to perform a liquid treatment by a processing liquid to a surface of a semiconductor wafer (hereinafter merely referred to as "wafer"), a single-substrate-processing apparatus processing a substrate one by one may be used. One of such liquid treatments is an etching treatment which is performed by supplying an etchant to a main surface of the wafer. This single-substrate-processing apparatus comprises a spin chuck rotating the wafer while retaining the wafer generally horizontally, a nozzle for supplying a processing liquid to a center portion of a wafer surface rotated by the spin chuck, and a nozzle moving mechanism moving this nozzle above the wafer.

For example, when it is desired to perform the etching treatment to a device formation surface of the wafer where a device is formed, the wafer is held by the spin chuck with the device formation surface facing upward. Then the etchant is discharged from a processing liquid nozzle to an upper surface of the wafer rotated by the spin chuck, and at the same time, the nozzle moving mechanism moves the processing liquid nozzle. A liquid contact point of the etchant on the upper surface of the wafer moves following the movement of the processing liquid nozzle. The etchant can be spread over a whole area of the upper surface of the wafer by scanning this liquid contact point between a rotation center and a peripheral portion of the upper surface of the wafer. Thus, the etching treatment is performed on the upper surface of the wafer (see Patent Document 1).

PRIOR ART DOCUMENT

Patent Document

Patent Document 1: Japanese Unexamined Patent Publication No. 2007-19161

Outline of the Invention

Subject to be Solved by the Invention

After an etching treatment, a chemical liquid adhering to a wafer is washed out by supplying a rinsing liquid such as pure water (deionized water) to the wafer. After the chemical liquid is washed out, a low-surface-tension liquid (for example, IPA (isopropyl alcohol) solution) whose surface tension is lower than that of the rinsing liquid is supplied to a surface of the wafer, and the rinsing liquid adhering to the wafer is displaced by the low-surface-tension liquid. Thereafter, the low-surface-tension liquid adhering to the wafer is removed from the wafer by drying a wafer surface through high-speed rotation of the wafer and the like.

The etching treatment performed by a substrate processing apparatus includes an etching treatment for removing a sacrificial film from a surface of a wafer. In this case, a wafer to be treated may be formed on its surface with a pattern including, for example, a plurality of struts and a sacrificial film embedded between the plurality of struts. However, when the patter formed on the surface of the wafer has a high aspect ratio (for example, the aspect ratio is 8 or more), there may be a case that the pattern formed on the surface of the wafer is collapsed due to a surface tension of the rinsing liquid at the time of drying of the wafer. Even if the rinsing liquid is displace by the low-surface-tension liquid prior to drying of the wafer in order to suppress the collapse of the pattern, the pattern might be collapsed when the pattern has a higher aspect ratio (for example, the aspect ratio is 15 or more).

In order to remove a sacrificial film while suppressing a collapse of a pattern, the present Inventors studied removal of a sacrificial film not by wet etching but by dry etching. However, it has been found that dry etching has a low etching efficiency and takes a large amount of time to remove a sacrificial film.

Thus, the present invention aims at providing a sacrificial-film removal method and a substrate processing apparatus that can remove a sacrificial film from a surface of a substrate without taking a long time while suppressing or preventing a collapse of a pattern.

SUMMARY OF THE INVENTION

The present invention provides a sacrificial-film removal method of removing a sacrificial film from a surface of a substrate provided with a plurality of struts and the sacrificial film embedded between the plurality of struts, including: a wet etching step where the sacrificial film is removed to its halfway depth by supplying an etchant to the surface of the substrate; a rinse step where a residue adhering to the surface of the substrate is washed out by supplying a rinsing liquid to the surface of the substrate after the wet etching step; a drying step where a liquid component on the surface of the substrate is removed after the rinse step; and a dry etching step where the sacrificial film remaining on the surface of the substrate is removed by supplying an etching gas to the surface of the substrate after the drying step.

According to this method, in the wet etching step, the sacrificial film embedded between the plurality of struts is not entirely removed but is removed to its halfway depth. The sacrificial film not removed in the wet etching step is removed in the dry etching step after the drying step. That is, according to this method, since the dry etching step and the wet etching step whose etching efficiency is higher than the dry etching step are both used, removal of the sacrificial film can be performed in a relatively short time.

A surface tension of the rinsing liquid acts on a portion of each strut which is exposed from the sacrificial film. In the wet etching step, the sacrificial film is only removed to its halfway depth. As a result, an influence of the surface tension of the rinsing liquid on each strut in the following drying step can be made smaller in comparison to a case where the entirety of the sacrificial film is removed by the wet etching. Thus, the collapse of the strut can be suppressed or prevented in the drying step.

In an embodiment of the present invention, the method further includes a low-surface-tension liquid displacing step where the rinsing liquid on the surface of the substrate is displaced with a low-surface-tension liquid whose surface tension is lower than that of the rinsing liquid by supplying the low-surface-tension liquid to the surface of the substrate after the rinse step and prior to the drying step.

According to this method, the low-surface-tension liquid whose surface tension is lower than that of the rinsing liquid is supplied to the surface of the substrate after the rinse step, and the rinsing liquid present between the plurality of struts is displaced with the low-surface-tension liquid. Thus, the surface tension acting on each strut becomes lower, and therefore, the collapse of the strut at the time of drying can be suppressed or prevented more effectively.

Further, a supporting film supporting the plurality of struts may be further formed on the surface of the substrate, the supporting film may be provided with a plurality of hole portions, and removal by the etchant may be started from portions of the sacrificial film corresponding to the plurality of hole portions in the wet etching step.

According to this method, since the plurality of struts are supported by the supporting film, the collapse of the struts can be suppressed or prevented more effectively. The wet etching step starts from the portions of the sacrificial film corresponding to the hole portions, and the etchant entering from these hole portions etches the sacrificial film to form a space between the supporting film and the sacrificial film. In the following dry etching step, the etching gas is supplied to the above space to act on the whole area of the sacrificial film evenly. Thus, etching of the sacrificial film can be performed evenly.

In the above method, a natural oxide film may be formed on a surface of the supporting film, and the method may further include a preprocessing step where the natural oxide film formed on the surface of the supporting film is removed prior to the wet etching step.

The natural oxide film may be formed on the surface of the supporting film. If the wet etching step is performed in a state where the natural oxide film is formed, etching of the sacrificial film may not evenly progress since the natural oxide film may get in the way.

Therefore, like the above-described method, uneven etching of the sacrificial film can be suppressed or prevented effectively by performing the preprocessing step where the natural oxide film is removed prior to the wet etching step.

Further, the invention provides a substrate processing apparatus, including: a substrate holding unit holding a substrate provided with a plurality of struts and a sacrificial film embedded between the plurality of struts; an etchant supply unit for supplying an etchant to the substrate held by the substrate holding unit; an etching gas supply unit for supplying an etching gas to the substrate held by the substrate holding unit; a rinsing liquid supply unit for supplying a rinsing liquid to the substrate held by the substrate holding unit; a substrate rotating unit for rotating the substrate held by the substrate holding unit; and a control unit controlling the etchant supply unit, the etching gas supply unit, the rinsing liquid supply unit and the substrate rotating unit, wherein the control unit performs a wet etching step where the sacrificial film is removed to its halfway depth by supplying an etchant to the surface of the substrate, a rinse step where a residue adhering to the surface of the substrate is washed out by supplying a rinsing liquid to the surface of the substrate after the wet etching step, a drying step where a liquid component on the surface of the substrate is removed after the rinse step, and a dry etching step where the sacrificial film remaining on the surface of the substrate is removed by supplying an etching gas to the surface of the substrate after the drying step.

According to this configuration, in the wet etching step, the sacrificial film embedded between the plurality of struts is not entirely removed but is removed to its halfway depth. The sacrificial film not removed in the wet etching step is removed in the dry etching step after the drying step. That is, according to this configuration, since the dry etching step and the wet etching step whose etching efficiency is higher than the dry etching step are both used, removal of the sacrificial film can be performed in a relatively short time.

The surface tension of the rinsing liquid acts on a portion of each strut which is exposed from the sacrificial film. In the wet etching step, the sacrificial film is only removed to its halfway depth. As a result, an influence of the surface tension of the rinsing liquid on each strut in the following drying step can be made smaller in comparison to a case where the entirety of the sacrificial film is removed by the wet etching. Thus, the collapse of the strut can be suppressed or prevented in the drying step.

In this case, the substrate holding unit may include a first substrate holding unit holding the substrate, and a second substrate holding unit holding the substrate. The substrate processing apparatus may further include a wet processing chamber for performing a wet etching treatment using an etchant to the substrate, and a dry processing chamber provided in a manner separated from the wet processing chamber for performing a dry etching treatment using an etching gas to the substrate after the wet etching treatment. The wet processing chamber may accommodate the substrate holding unit, the substrate rotating unit, the etchant supply unit and the rinsing liquid supply unit, and the dry processing chamber may accommodate the substrate holding unit and the etching gas supply unit.

According to this configuration, the wet etching step, the rinse step and the drying step are performed in the wet processing chamber, and the dry etching step is performed in the dry processing chamber. Thus, the etching treatments on a single substrate can be favorably performed over the plurality of chambers.

Further, the substrate processing apparatus may further include a processing chamber collectively accommodating the substrate holding unit, the substrate rotating unit, the etchant supply unit, the rinsing liquid supply unit and the etching gas supply unit.

According to this configuration, the wet etching step, the rinse step, the drying step and the dry etching step can be continuously performed to one substrate. Thus, the etching treatments to one substrate can be performed in a relatively short time.

One embodiment of the present invention may further include a low-surface-tension liquid supply unit for supplying a low-surface-tension liquid whose surface tension is lower than that of the rinsing liquid to the substrate held by the substrate holding unit, wherein the control unit may perform a low-surface-tension liquid displacing step where the rinsing liquid on the surface of the substrate is displaced with the low-surface-tension liquid by supplying the low-surface-tension liquid to the surface of the substrate after the rinse step and prior to the drying step.

According to this configuration, the low-surface-tension liquid whose surface tension is lower than that of the rinsing liquid is supplied to the surface of the substrate after the rinse step, and the rinsing liquid present between the plurality of struts is displaced with the low-surface-tension liquid. Thus, the surface tension acting on each strut becomes lower, and therefore, the collapse of the strut at the time of drying can be suppressed or prevented more effectively.

In this case, the substrate holding unit may include a first substrate holding unit holding the substrate, and a second substrate holding unit holding the substrate. The substrate processing apparatus may further include: a wet processing chamber for performing a wet etching treatment using an etchant to the substrate; and a dry processing chamber provided in a manner separated from the wet processing chamber for performing a dry etching treatment using an etching gas to the substrate after the wet etching treatment. The wet processing chamber may accommodate the substrate holding unit, the substrate rotating unit, the etchant supply unit, the rinsing liquid supply unit and the low-surface-tension liquid supply unit, and the dry processing chamber may accommodate the substrate holding unit and the etching gas supply unit.

According to this configuration, the wet etching step, the rinse step, the low-surface-tension liquid supply step and the drying step are performed in the wet processing chamber, and the dry etching step is performed in the dry processing chamber. Thus, the etching treatments on a single substrate can be favorably performed over the plurality of chambers.

Further, there may be further included a processing chamber collectively accommodating the substrate holding unit, the substrate rotating unit, the etchant supply unit, the rinsing liquid supply unit, the low-surface-tension liquid supply unit and the etching gas supply unit.

According to this configuration, the wet etching step, the rinse step, the low-surface-tension liquid supply step, the drying step and the dry etching step can be continuously performed to one substrate. Thus, the etching treatments to one substrate can be performed in a relatively short time.

The above-described and yet other objects, features and effects of the present invention are revealed by the following embodiments described with reference to accompanied drawings.

BRIEF DESCRIPTION OF DRAWINGS

FIG. 5A is a sectional view showing a pattern formation step of the object to be processed shown in FIG. 4A.

FIG. 5B is a sectional view showing a pattern formation step of the object to be processed shown in FIG. 4A.

FIG. 5C is a sectional view showing a next production process of FIG. 5B.

FIG. 5D is a sectional view showing a next production process of FIG. 5B.

FIG. 5E is a sectional view showing a next production process of FIG. 5D.

FIG. 6A is a flow chart showing a process example of an etching treatment in the wet processing unit shown in FIG. 1.

FIG. 6B is a flow chart showing a process example of an etching treatment in the dry processing unit shown in FIG. 1.

FIG. 7A is an illustrative view for explaining a process example of an etching treatment.

FIG. 7B is an illustrative view for explaining a process example of an etching treatment.

FIG. 7C is an illustrative view for explaining a process example of an etching treatment.

FIG. 7D is an illustrative view for explaining a process example of an etching treatment.

DESCRIPTION OF EMBODIMENTS

Figure 1:
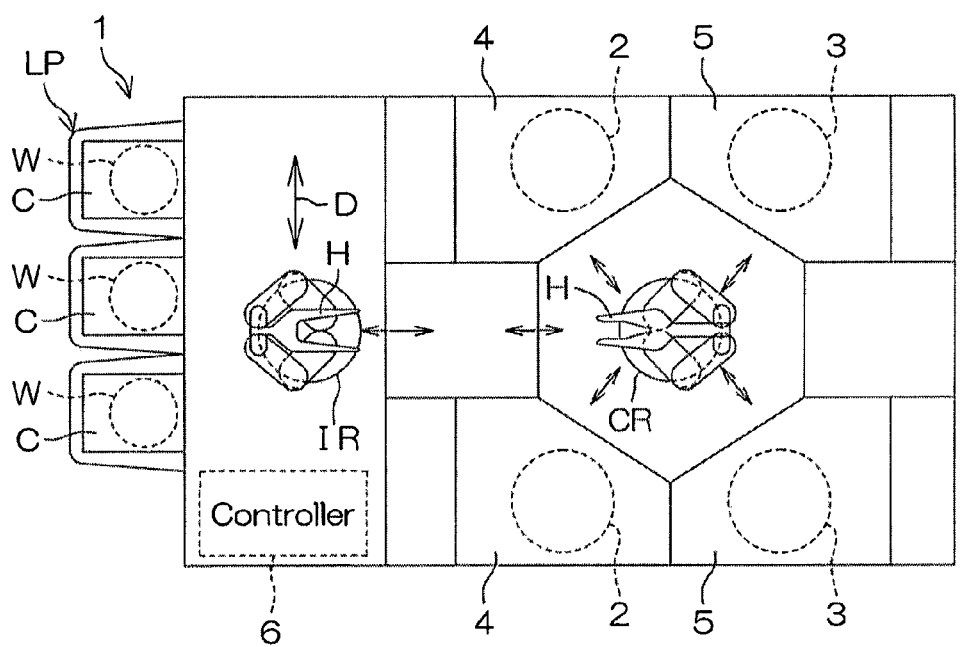
FIG. 1 is a schematic plan view of an outline configuration of a substrate processing apparatus according to a first embodiment of the present invention.

FIG. 1 is a schematic plan view of an outline configuration of a substrate processing apparatus 1 according to a first embodiment of the present invention.

As shown in FIG. 1, the substrate processing apparatus 1 is a single-substrate-processing apparatus processing a semiconductor substrate (hereinafter referred to merely as "wafer W") one by one. The substrate processing apparatus 1 is, for example, a substrate processing apparatus for removing a sacrificial film 73 (see FIG. 4B) formed of polysilicon (Poly-Si) from a surface of the wafer W.

The substrate processing apparatus 1 includes a load port LP as a container holding unit holding a plurality of carriers C as containers, a wet processing unit 2 for performing a wet etching treatment using an etchant to the wafer W, and a dry processing unit 3 for performing a dry etching treatment using an etching gas to the wafer W. Two wet processing units 2 and two dry processing units 3 are provided in this embodiment. The wet processing unit 2 is disposed in a wet processing chamber 4. Further, the dry processing unit 3 is disposed in a dry processing chamber 5. The wet processing chamber 4 and the dry processing chamber 5 are disposed adjacent to each other.

The substrate processing apparatus 1 further includes an indexer robot IR positioned with respect to the load port LP, a center robot CR transporting the wafer W between the indexer robot IR and the wet processing unit 2 as well as the dry, processing unit 3, and a controller 6 controlling movement of devices and opening and closing of valves provided in the substrate processing apparatus 1.

As shown in FIG. 1, the load port LP, the wet processing unit 2 and the dry processing unit 3 are disposed in a manner spaced from one another in a horizontal direction. The plurality of carriers C containing a plurality of wafers W are arranged in a horizontal arranging direction D in a plan view. The indexer robot IR transports the plurality of wafers W one by one from the carriers C to the center robot CR, and transports the plurality of wafers W one by one from the center robot CR to the carriers C. Similarly, the center robot CR brings in the plurality of wafers W one by one from the indexer robot IR to the wet processing units 2. Further, the center robot CR brings out the wafer W from the wet processing unit 2 and brings in the wafer W to the dry processing unit 3.

The indexer robot IR includes two hands H having a U shape in a plan view. The two hands H are disposed at different heights. Each hand H supports the wafer W in a horizontal position. The indexer robot IR moves the hand H in horizontal and vertical directions. Further, the indexer robot IR changes an orientation of the hand H by rotating (itself) around a vertical line axis. The indexer robot IR moves in the arranging direction D along a path passing a delivery position (position shown in FIG. 1). The delivery position is in a plan view a position where the indexer robot IR and the center robot CR are opposed in a direction orthogonal to the arranging direction D. The indexer robot IR makes the hand H opposed to any of the carriers C and the center robot CR. The indexer robot IR performs a bringing-in motion of bringing the wafer W in the carrier C and a bringing-out motion of bringing out the wafer W from the carrier C by moving the hand H. Further, the indexer robot IR cooperates with the center robot CR to perform at the delivery position a delivery motion of moving the wafer W from one to the other of the indexer robot IR and the center robot CR.

Further, the center robot CR includes two hands H having a U shape in a plan view, like the indexer robot IR. The two hands H are disposed at different heights. Each hand H supports the wafer W in a horizontal position. The center robot CR moves the hand H in the horizontal and vertical directions. Further, the center robot CR changes an orientation of the hand H by rotating (itself) around a vertical line axis. The center robot CR is surrounded by the wet processing unit 2 and the dry processing unit 3 in a plan view. The center robot CR makes the hand H opposed to the wet processing unit 2 or the dry processing unit 3 or the indexer robot IR. Further, the center robot CR performs a bringing-in motion of bringing the wafer W in the wet processing unit 2 and the dry processing unit 3 and a bringing-out motion of bringing out the wafer W from the wet processing unit 2 and the dry processing unit 3 by moving the hand H. Further, the center robot CR cooperates with the indexer robot IR to perform the delivery motion of moving the wafer W from one to the other of the indexer robot IR and the center robot CR.

Figure 2:
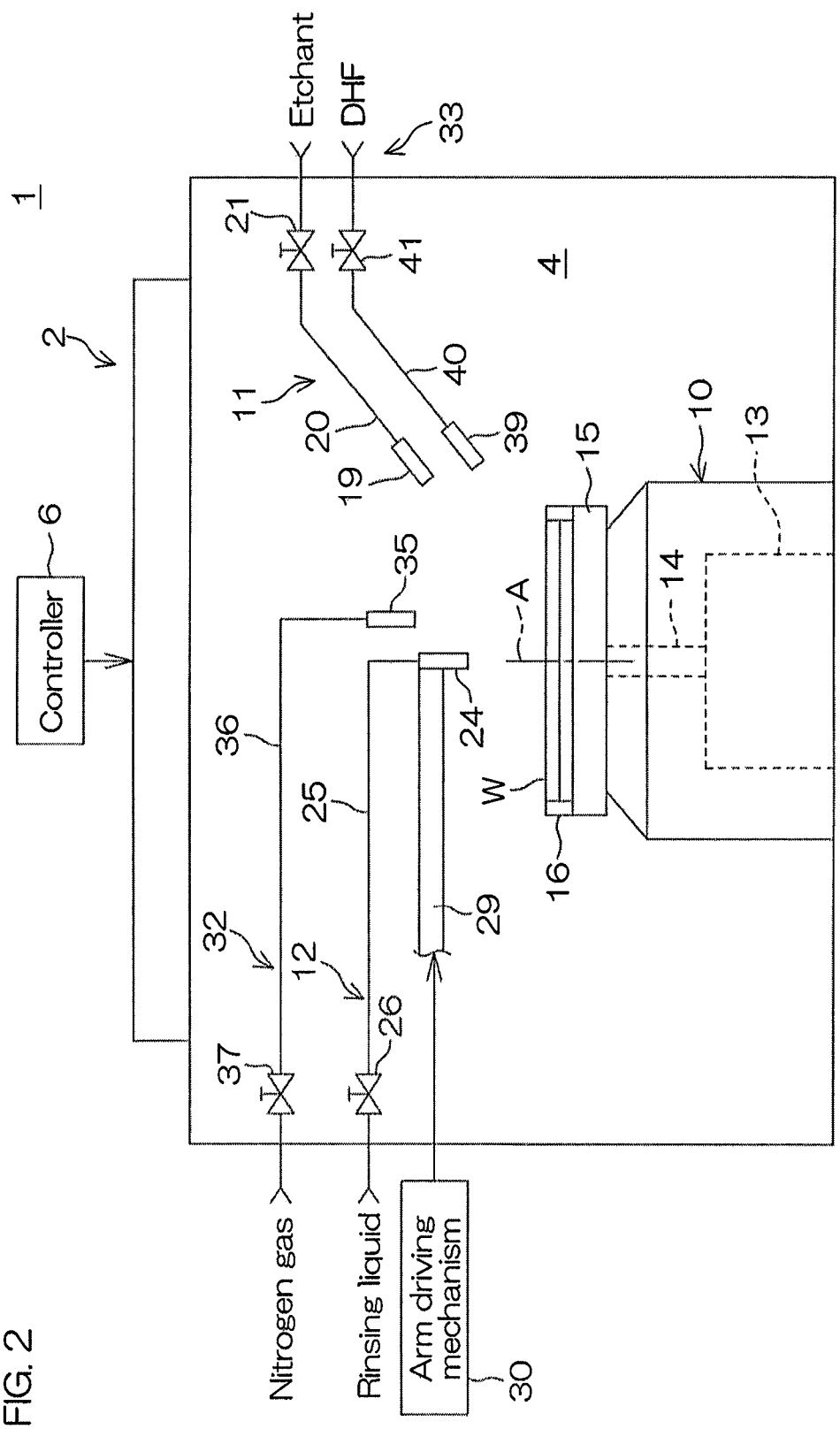
FIG. 2 is a schematic view of an inside of a wet processing unit in FIG. 1 viewed in a horizontal direction.

FIG. 2 is a schematic view of an inside of the wet processing unit 2 in FIG. 1 viewed in the horizontal direction.

In the wet processing chamber 4 defined by partition walls, the wet processing unit 2 includes a spin chuck 10 (first substrate holding unit) for holding the wafer W, an etchant supply unit 11 for supplying an etchant to the wafer W held by the spin chuck 10, and a rinsing liquid supply unit 12 for supplying a rinsing liquid to the wafer W held by the spin chuck 10.

As the spin chuck 10, this embodiment employs a clamping type. The spin chuck 10 includes an electric motor 13 (substrate rotating unit), a cylindrical rotation shaft 14 integrated with a drive shaft of the electric motor 13 and extending vertically, a disk-shaped spin base 15 attached generally horizontally to an upper end of the rotation shaft 14, and a plurality of (at least three; for example, six) clamping members 16 disposed at predetermined intervals (for example, at regular intervals) in a circumferential direction on a peripheral portion of an upper surface of the spin base 15.

Each clamping member 16 is configured to hold the wafer W horizontally at a substrate holding height (see a position in FIG. 2) above the upper surface of the spin base 15 at a certain interval. For example, a known link mechanism moving the clamping member 16 according to a rotation of the rotation shaft 14 is attached to the clamping member 16. The link mechanism is accommodated in the spin base 15, for example. The spin chuck 10 holds tightly the wafer W by clamping it with the clamping member 16 abutted to a peripheral portion of the wafer W. A rotational driving force from the electric motor 13 is input to the rotation shaft 14, whereby the wafer W held by the clamping member 16 is rotated integrally with the spin base 15 around a vertical rotation axis line A passing a center of the wafer W. Additionally, in place of the clamping spin chuck 10, a vacuum-suction spin chuck may be employed which holds the wafer W at a horizontal position, for example, by vacuum suction of a rear surface of the wafer W, and which rotates the held wafer W by further rotating the wafer W around the rotation axis line A in that state.

The etchant supply unit 11 includes an etchant nozzle 19. The etchant nozzle 19 is configured by a straight nozzle discharging a liquid in a state of a continuous flow. The etchant nozzle 19 is disposed fixedly in the wet processing chamber 4 with a discharge port thereof facing to a surface center portion of the wafer W. An etchant piping 20 to which the etchant is supplied from an etchant supply source is connected to the etchant nozzle 19. An etchant valve 21 for opening and closing the etchant piping 20 is interposed in the etchant piping 20. When the etchant valve 21 is opened, the etchant is supplied from the etchant piping 20 to the etchant nozzle 19. When the etchant valve 21 is closed, supply of the etchant from the etchant piping 20 to the etchant nozzle 19 is stopped. Examples of the etchant can include TMAH (Tetra methyl ammonium hydroxide), HF (hydrofluoric acid), and DHF (Diluted hydrofluoric acid).

The rinsing liquid supply unit 12 includes a rinsing liquid nozzle 24. The rinsing liquid nozzle 24 is configured by a straight nozzle discharging a liquid in a state of a continuous flow. A rinsing liquid piping 25 to which the rinsing liquid is supplied from a rinsing liquid supply source is connected to the rinsing liquid nozzle 24. A rinsing liquid valve 26 for opening and closing the rinsing liquid piping 25 is interposed in the rinsing liquid piping 25. When the rinsing liquid valve 26 is opened, the rinsing liquid is supplied from the rinsing liquid piping 25 to the rinsing liquid nozzle 24. When the rinsing liquid valve 26 is closed, the supply of the rinsing liquid from the rinsing liquid piping 25 to the rinsing liquid nozzle 24 is stopped. The rinsing liquid is, for example, DIW, but is not limited to DIW, and may be any of carbonated water, electrolytic ionized water, hydrogen water, ozone water, and hydrochloric acid water of a dilute concentration (for example, about 10 ppm to 100 ppm).

A nozzle arm 29 swingable in a horizontal plane above the spin chuck 10 is attached to the rinsing liquid nozzle 24. An arm driving mechanism 30 is connected to the nozzle arm 29, and the nozzle arm 29 is swung above the spin chuck 10 by transmitting a driving force of the arm driving mechanism 30 to the nozzle arm 29. That is, the rinsing liquid nozzle 24 is a so-called scan nozzle in which a liquid contact position of the rinsing liquid on the surface of the wafer W is scanned by swinging of the nozzle arm 29.

The wet processing unit 2 further includes a nitrogen gas supply unit 32 for supplying a nitrogen gas into the wet processing chamber 4, and a DHF supply unit 33 for supplying DHF to the surface of the wafer W held by the spin chuck 10 to remove a natural oxide film 74 (see FIG. 4B) formed on the surface of the wafer W.

The nitrogen gas supply unit 32 includes a nitrogen gas nozzle 35. The nitrogen gas nozzle 35 is configured by a straight nozzle. The nitrogen gas nozzle 35 is disposed fixedly in the wet processing chamber 4 with a discharge port thereof facing to the surface center portion of the wafer W. A nitrogen gas piping 36 to which a nitrogen gas is supplied from a nitrogen gas supply source is connected to the nitrogen gas nozzle 35. A nitrogen gas valve 37 for opening and closing the nitrogen gas piping 36 is interposed in the nitrogen gas piping 36. When the nitrogen gas valve 37 is opened, the nitrogen gas is supplied from the nitrogen gas piping 36 to the nitrogen gas nozzle 35. When the nitrogen gas valve 37 is closed, supply of the nitrogen gas from the nitrogen gas piping 36 to the nitrogen gas nozzle 35 is stopped.

The DHF supply unit 33 includes a DHF nozzle 39. The DHF nozzle 39 is configured by a straight nozzle discharging a liquid in a state of a continuous flow. The DHF nozzle 39 is disposed fixedly in the wet processing chamber 4 with a discharge port thereof facing to the surface center portion of the wafer W. A DHF piping 40 to which DHF is supplied from a DHF supply source is connected to the DHF nozzle 39. A DHF valve 41 for opening and closing the DHF piping 40 is interposed in the DHF piping 40. When the DHF valve 41 is opened, DHF is supplied from the DHF piping 40 to the DHF nozzle 39. When the DHF valve 41 is closed, supply of DHF from the DHF piping 40 to the DHF nozzle 39 is stopped.

Additionally, the etchant nozzle 19 and the DHF nozzle 39 are not necessarily disposed fixedly in the wet processing chamber 4, and may employ, for example, a form of a so-called scan nozzle which is attached to an arm swingable in a horizontal plane above the spin chuck 10 and scans a liquid contact position of the DHF on the surface of the wafer W by the swinging of this arm, like the above-described rinsing liquid nozzle 24.

Figure 3:
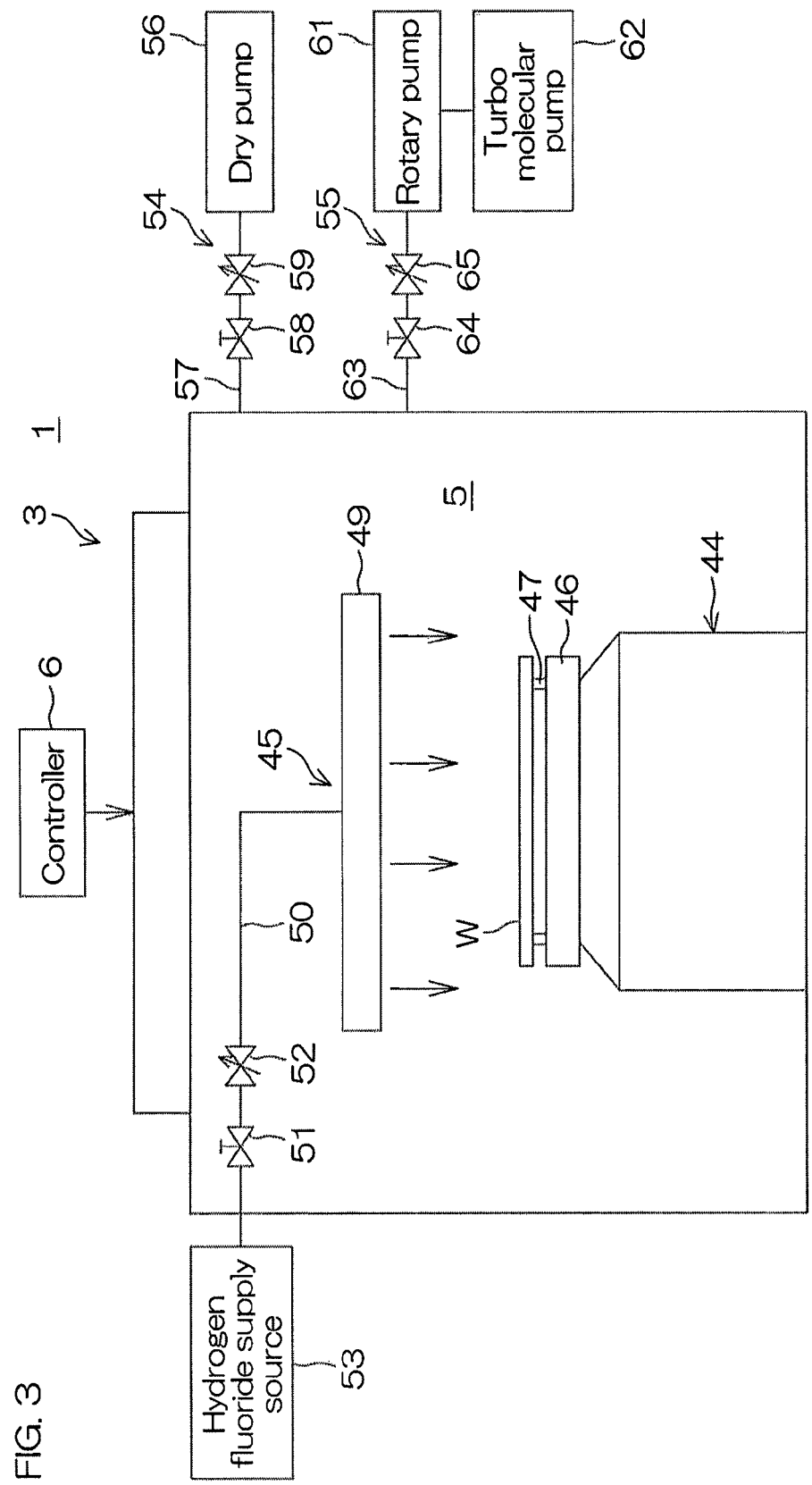
FIG. 3 is a schematic view of an inside of a dry processing unit in FIG. 1 viewed in the horizontal direction.

FIG. 3 is a schematic view of an inside of the dry processing unit 3 in FIG. 1 viewed in the horizontal direction.

In the dry processing chamber 5 defined by partition walls, the dry processing unit 3 includes a support member 44 (second substrate holding unit) for holding the wafer W in a stationary state, and a gas supply unit 45 (etching gas supply unit) for supplying an etching gas into the dry processing chamber 5.

The support member 44 includes a base portion 46, and a plurality of (at least three; for example, six) support pins 47 disposed at regular intervals in a circumferential direction on a peripheral portion of an upper surface of the base portion 46. The support pins 47 is configured to hold the wafer W horizontally at a substrate holding height above an upper surface of the base portion 46 at a certain interval.

The gas supply unit 45 includes a gas supply plate 49. The gas supply plate 49 is disposed above the support member 44. More specifically, the gas supply plate 49 is disposed fixedly in the dry processing chamber 5 in a manner to be opposed to an upper surface of the wafer W above the support member 44. The gas supply plate 49 is formed, for example, in a disk shape, and has an outer diameter larger than that of the wafer W. A hydrogen fluoride piping 50, to which hydrogen fluoride is supplied from a hydrogen fluoride supply source 53, is connected to the gas supply plate 49. Hydrogen fluoride supplied from the hydrogen fluoride supply source 53 is discharged to the surface of the wafer W via the hydrogen fluoride piping 50 from a plurality of processing liquid supply holes (not shown) formed, for example, in an opposed surface of the gas supply plate 49 opposed to the surface of the wafer W.

A hydrogen fluoride valve 51 and a hydrogen fluoride flow rate adjusting valve 52 for opening and closing the hydrogen fluoride piping 50 are interposed in the hydrogen fluoride piping 50. When the hydrogen fluoride valve 51 is opened, hydrogen fluoride is supplied from the hydrogen fluoride piping 50 to the gas supply plate 49, and when the hydrogen fluoride valve 51 is closed, supply of hydrogen fluoride from the hydrogen fluoride piping 50 to the gas supply plate 49 is stopped. The hydrogen fluoride flow rate adjusting valve 52 adjusts a discharge flow rate of hydrogen fluoride discharged from the gas supply plate 49 by adjusting an opening amount of the hydrogen fluoride piping 50.

The dry processing unit 3 further includes a first depressurizing unit 54 and a second depressurizing unit 55 for respectively depressurizing the dry processing chamber 5.

The first depressurizing unit 54 includes a dry pump 56. The dry pump 56 is connected to the dry processing chamber 5 via a depressurizing piping 57. A depressurizing valve 58 for opening and closing the depressurizing piping 57 and a depressurizing adjusting valve 59 are interposed in the depressurizing piping 57.

The second depressurizing unit 55 includes a rotary pump 61 and a turbomolecular pump 62. The rotary pump 61 and the turbo molecular pump 62 are connected to the dry processing chamber 5 via a vacuum piping 63. A vacuum valve 64 for opening and closing the vacuum piping 63 and a vacuum adjusting valve 65 are interposed in the vacuum piping 63.

When both of the rotary pump 61 and the turbo molecular pump 62 are driven and the vacuum valve 64 is opened in a state where drive of the dry pump 56 is stopped, an inside of the dry processing chamber 5 is set to a vacuum state. Further, the vacuum valve 64 is closed, the dry processing chamber 5 is released from a vacuum state.

When the dry pump 56 is driven and the depressurizing valve 58 is opened in a state where drive of both of the rotary pump 61 and the turbo molecular pump 62 are stopped, the inside of the dry processing chamber 5 is set to a depressurized state. A depressurized degree in the dry processing chamber 5 is adjusted by the depressurizing adjusting valve 59. Further, when the depressurizing valve 58 is closed, the inside of the dry processing chamber 5 is released from the depressurized state.

The indexer robot IR, the center robot CR, the electric motor 13, the arm driving mechanism 30, the etchant valve 21, the rinsing liquid valve 26, the nitrogen gas valve 37, the DHF valve 41, the hydrogen fluoride valve 51, the hydrogen fluoride flow rate adjusting valve 52, the dry pump 56, the depressurizing valve 58, the depressurizing adjusting valve 59, the turbo molecular pump 62, the rotary pump 61, the vacuum valve 64, the vacuum adjusting valve 65 and the like are connected to the controller 6 as objects to be controlled.

Figure 4A:
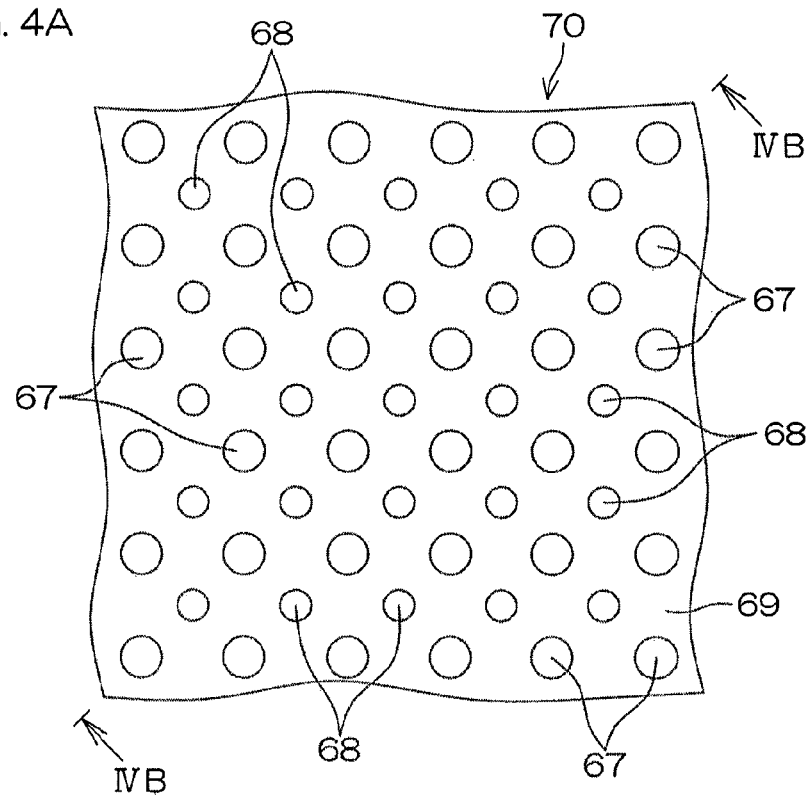
FIG. 4A is a schematic plan view for illustrating an object to be processed by the substrate processing apparatus in FIG. 1.
Figure 4B:
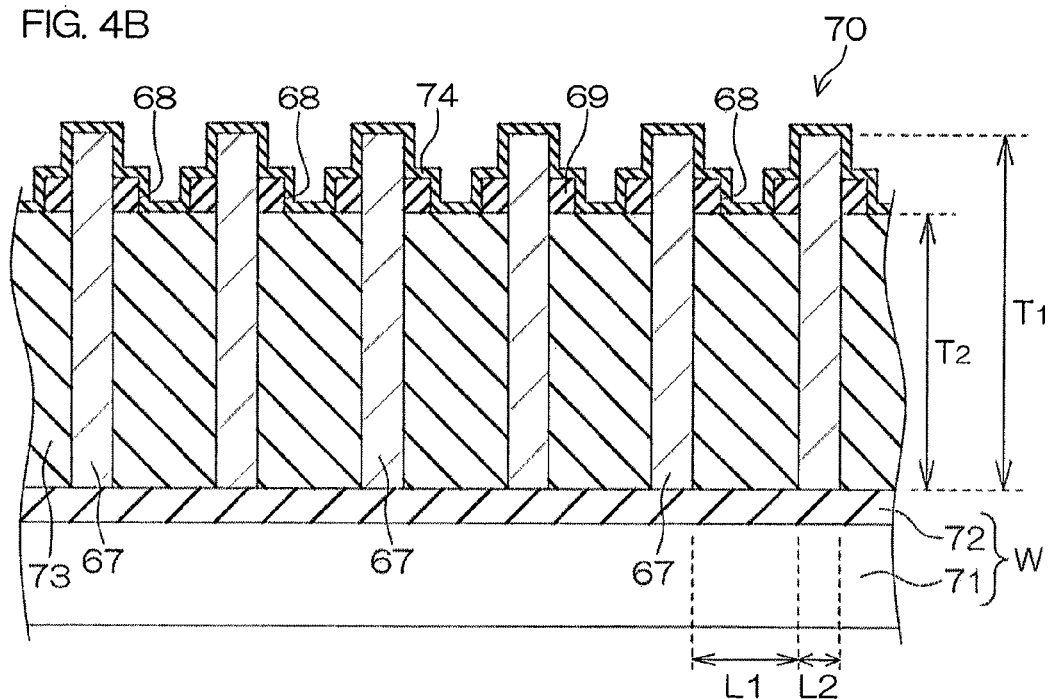
FIG. 4B is a sectional view viewed from a cut surface line IVB-IVB in FIG. 4A.

FIG. 4A is a schematic plan view for illustrating the wafer W which is an object to be processed by the substrate processing apparatus 1. FIG. 4B is a sectional view viewed from a cut surface line IVB-IVB in FIG. 4A. Additionally, FIG. 4A is a plan view in which the surface of the wafer W is partially extracted.

As shown in FIGS. 4A and 4B, the surface of the wafer W which is the object to be processed by the substrate processing apparatus 1 is provided with a pattern 70 that includes a plurality of cylinders 67 (struts) and a bridge 69 (supporting film) having through holes 68 (hole portions) and supporting the plurality of cylinders 67 in a manner spaced from the surface of the wafer W.

As shown in the sectional view of FIG. 4B, the wafer W includes a silicon substrate 71 and an etching stopper layer 72 formed on a surface of the silicon substrate 71. The etching stopper layer 72 is formed of, for example, silicon nitride (SiN), and is provided for preventing excessive etching at a time of an etching treatment. The sacrificial film 73 formed of, for example, polysilicon and the bridge 69 formed of silicon nitride are formed in this order on a surface of the etching stopper layer 72.

The plurality of cylinders 67 are made of an electrode material formed of, for example, titanium nitride (TiN), and are formed in dot shapes in a plan view viewing the surface of the wafer W from a normal line direction as shown in FIG. 4A. More specifically, in this plan view, the cylinders 67 are disposed in an aligned manner of an array in a matrix shape respectively spaced at regular intervals in directions intersecting at right angles with one another.

Further, as shown in FIG. 4B, the plurality of cylinders 67 are formed so as to penetrate the sacrificial film 73 and the bridge 69 to reach the etching stopper layer 72. The plurality of cylinders 67 are formed so as to project further upward from a surface of the bridge 69. That is, a height $T_1$ of a cylinder 67 from the etching stopper layer 72 is made larger than a film thickness $T_2$ of the sacrificial film 73. Here, an aspect ratio of each cylinder 67 (value obtained through dividing the height $T_1$ of the cylinder 67 by a sum of a distance L1 between cylinders 67 adjacent to each other and a width L2 of the cylinder 67) is, for example, 15 or more.

As shown in FIGS. 4A and 4B, each region surrounded by four cylinders 67 adjacent to one another in both of a column direction and a row direction is provided with the through hole 68 penetrating the bridge 69 to expose the sacrificial film 73. In this plan view, the through holes 68 are disposed in an aligned manner of an array in a matrix shape respectively spaced at regular intervals in directions intersecting at right angles with one another. Around the cylinder 67, each through hole 68 is disposed at a barycentric position of a square whose apexes are at positions of four cylinders 67 surrounding an immediate outside of this through hole 68. The natural oxide film 74 including silicon oxide ($SiO_2$), for example, is formed so as to cover respective surfaces of the sacrificial film 73, the bridge 69 and the cylinders 67.

Additionally, when the aspect ratio of the plurality of cylinders 67 is relatively low, the bridge 69 is not necessarily formed on the surface of the wafer W.

Next, referring to FIGS. 5A to 5E, formation steps of the pattern 70 are described. FIGS. 5A to 5E are sectional views showing pattern 70 formation steps of the wafer W being the object to be processed shown in FIG. 4A. All of FIGS. 5A to 5E are sectional views corresponding to FIG. 4B.

To form the wafer W being the object to be processed, wafer W including the silicon substrate 71 and the etching stopper layer 72 is first prepared. Next, polysilicon is deposited on the surface of the etching stopper layer 72 to form the sacrificial film 73. After the sacrificial film 73 is formed, silicon nitride is deposited on a surface of the sacrificial film 73 to form the bridge 69, as shown in FIG. 5A. Deposition of polysilicon and silicon nitride is performed, for example, by a CVD method (Chemical Vapor Deposition).

After the bridge 69 is formed, a hard mask 75 selectively having an opening in a region where the cylinder 67 is to be formed is formed on the surface of the bridge 69. After the hard mask 75 is formed, the bridge 69 and the sacrificial film 73 are etched using the hard mask 75 as an etching mask, as shown in FIG. 5B. Thus, an opening 76 for the cylinder 67 is formed.

After the opening 76 for the cylinder 67 is formed, titanium nitride is embedded in the opening 76 for the cylinder 67 so as to be flush with a surface of the hard mask 75, as shown in FIG. 5C. Titanium nitride is embedded by the CVD method, for example. Titanium nitride deposited outside the opening 76 for the cylinder 67 is removed by a CMP method (Chemical Mechanical Polishing). Thus, titanium nitride is embedded in the opening 76 for the cylinder 67 so as to be flush with the surface of the hard mask 75.

After titanium nitride is embedded in the opening 76 for the cylinder 67, the hard mask 75 is removed by an etching treatment, as shown in FIG. 5D. Thus, the cylinder 67 projecting from the surface of the bridge 69 is formed.

After the cylinder 67 is formed, the through hole 68 exposing the sacrificial film 73 is formed at a predetermined position by selectively etching the surface of the bridge 69, as shown in FIG. 5E. Then, the natural oxide film 74 is formed so as to cover the respective surfaces of the sacrificial film 73, the bridge 69 and the cylinders 67. Through the above steps, the wafer W being the object to be processed shown in FIG. 4B can be obtained.

Thus, the etching stopper layer 72, the cylinders 67, the sacrificial film 73, the bridge 69 and the natural oxide film 74 are formed on the silicon substrate 71. The substrate processing apparatus 1 performs the wet etching treatment in the wet processing unit 2 and the dry etching treatment in the dry processing unit 3 to the wafer W having such a configuration.

FIG. 6A is a flow chart showing a process example of the wet etching treatment by the wet processing unit 2 shown in FIG. 1.

Referring to FIG. 6A, the substrate processing apparatus 1 sequentially performs wafer bringing-in of step S1 where the wafer W is brought into the wet processing chamber 4, a natural oxide film removing step (preprocessing step) of step S3 where DHF is supplied to the surface of the wafer W after rotation of the wafer W is started in step S2, a first rinse step of step S4 where the rinsing liquid is supplied to the surface of the wafer W, a sacrificial film preetching step (wet etching step) of step S5 where the etchant is supplied to the surface of the wafer W to remove part of the sacrificial film 73, a second rinse step of step S6 where the rinsing liquid is supplied to the surface of the wafer W, a drying step of step S7 where the surface of the wafer W is dried by removing a liquid component, and wafer bringing-out of step S8 where the treated wafer W is brought out from the wet processing chamber 4.

FIG. 6B is a flow chart showing a process example of the dry etching treatment by the dry processing unit 3 shown in FIG. 1.

Referring to FIG. 6B, the substrate processing apparatus 1 sequentially performs wafer bringing-in of step S9 where the wafer W that has been subjected to the wet etching treatment is brought into the dry processing chamber 5, a depressurizing step of step S10 where the inside of the dry processing chamber 5 is depressurized, a dry etching step of step S11 where the etching gas is supplied into the dry processing chamber 5, a depressurizing releasing step of step S12 where a pressure of the inside of the dry processing chamber 5 is returned to a normal pressure, and wafer bringing-out of step S13 where the wafer W that has been subjected to the dry etching treatment is brought out from the dry processing chamber 5.

FIGS. 7A to 7F are illustrative views for explaining process examples of the wet and dry etching treatments. Referring to FIGS. 1 to 7F, the process examples of the etching treatments by the substrate processing apparatus 1 (wet and dry etching treatments) are more specifically described below. All of FIGS. 7A to 7F are sectional views corresponding to FIG. 4B.

First, at the time of starting the wet etching treatment by the wet processing unit 2, the controller 6 controls the indexer robot IR to transport the wafer W accommodated in the carrier C after the step of FIG. 5E from this carrier C to a predetermined delivery position. Further, the controller 6 controls the center, robot CR to deliver the wafer W from the indexer robot IR to the center robot CR at the above predetermined delivery position, and brings the wafer W into the wet processing chamber 4 (step S1 in FIG. 6A: wafer bringing-in). The wafer W brought into the wet processing chamber 4 is held by the spin chuck 10 while the surface on which the predetermined pattern 70 is formed faces upward.

After the wafer W is held by the spin chuck 10, the controller 6 controls the electric motor 13 to start the rotation of the wafer W (step S2 in FIG. 6A: starting rotation). A rotation speed of the wafer W is raised to, for example, a predetermined rotation speed and is maintained at that rotation speed.

After the wafer W is accelerated to the predetermined rotation speed, the controller 6 opens the DHF valve 41 (see FIG. 2) to discharge DHF from the DHF nozzle 39 to the surface center portion of the wafer W (step S3 in FIG. 6A: sacrificial film removing step), as shown in FIG. 7A. DHF contacting the surface center portion of the wafer W expands from the surface center portion of the wafer W to a surface peripheral portion of the wafer W by a rotational centrifugal force of the wafer W, and thus, the natural oxide film 74 covering the respective surfaces of the sacrificial film 73, the bridge 69 and the cylinder 67 is removed.

The natural oxide film 74 (see FIG. 5E) may be formed on the surface of the wafer W transported from the carrier C, more specifically, on the respective surfaces of the bridge 69 and the cylinder 67. When the sacrificial film preetching step of step S5 where the sacrificial film 73 is removed in the state that the natural oxide film 74 is formed, there may be a case that etching of the sacrificial film 73 is not evenly progressed due to interference of the natural oxide film 74. Thus, by performing the natural oxide film removing step of step S3 before the sacrificial film preetching step of step S5, it can be effectively suppressed or prevented that the sacrificial film 73 is unevenly etched.

After a predetermined time has passed from the start of the supply of DHF, the controller 6 closes the DHF valve 41 to stop the supply of DHF to the surface of the wafer W.

After the supply of DHF is stopped, the controller 6 opens the rinsing liquid valve 26 (see FIG. 2) to discharge the rinsing liquid from the rinsing liquid nozzle 24 to the surface of the wafer W (step S4 in FIG. 6A: first rinsing step).

Further, the controller 6 controls the arm driving mechanism 30 to swing the nozzle arm 29 from the surface peripheral portion of the wafer W to the surface center portion of the wafer W, for example. Thus, the rinsing liquid nozzle 24 is moved from the surface peripheral portion of the wafer W to the surface center portion of the wafer W. Further, a supply position on the surface of the wafer W to which the rinsing liquid from the rinsing liquid nozzle 24 is guided moves within a range from the surface peripheral portion of the wafer W to the surface center portion of the wafer W in an arc-shaped trajectory intersecting a rotating direction of the wafer W. Thus, the rinsing liquid reaches a whole area of the surface of the wafer W to wash out residues such as DHF and the natural oxide film 74 remaining on the surface of the wafer W.

After a predetermined time has passed from the start of the supply of the rinsing liquid, the controller 6 closes the rinsing liquid valve 26 to stop the supply of the rinsing liquid to the surface of the wafer W. Further, the controller 6 controls the arm driving mechanism 30 to stop the swing of the nozzle arm 29.

After the supply of the rinsing liquid is stopped, the controller 6 opens the etchant valve 21 (see FIG. 2) to discharge the etchant (for example, TMAH) from the etchant nozzle 19 to the surface center portion of the wafer W (step S5 in FIG. 6A: sacrificial film preetching step), as shown in FIG. 7B. The etchant contacting the surface center portion of the wafer W expands from the surface center portion of the wafer W to the surface peripheral portion of the wafer W by the rotational centrifugal force of the wafer W.

The etchant supplied to the surface of the wafer W enters the through holes 68 formed in the bridge 69 and etches the sacrificial film 73 embedded between the surface of the wafer W and the bridge 69. In the sacrificial film preetching step of step S5, the sacrificial film 73 embedded between the surface of the wafer W and the bridge 69 is not entirely removed but is removed to its halfway depth.

When a predetermined time has passed from the start of the supply of the etchant and the sacrificial film 73 is removed to the halfway depth, the controller 6 closed the etchant valve 21 to stop the supply of the etchant to the surface of the wafer W.

After the supply of the etchant is stopped, the controller 6 opens the rinsing liquid valve 26 (see FIG. 2) to discharge the rinsing liquid (for example, DIW) from the rinsing liquid nozzle 24 to the surface center portion of the wafer W (step S6 in FIG. 6A: second rinsing step), as shown in FIG. 7C. Further, the controller 6 controls the arm driving mechanism 30 to swing the nozzle arm 29 from the surface peripheral portion of the wafer W to the surface center portion of the wafer W. Thus, the rinsing liquid nozzle 24 is moved from the surface peripheral portion of the wafer W to the surface center portion of the wafer W. Further, a supply position on the surface of the wafer W to which the rinsing liquid from the rinsing liquid nozzle 24 is guided moves within a range from the surface peripheral portion of the wafer W to the surface center portion of the wafer W in an arc-shaped trajectory intersecting the rotating direction of the wafer W. Thus, the rinsing liquid reaches the whole area of the surface of the wafer W to wash out residues such as the etchant and the natural oxide film 74 remaining on the surface of the wafer W.

After a predetermined time has passed from the start of the supply of the rinsing liquid, the controller 6 closes the rinsing liquid valve 26 to stop the supply of the rinsing liquid to the surface of the wafer W.

After the supply of the rinsing liquid is stopped, the controller 6 controls the electric motor 13 to raise the rotation speed of the wafer W to a rotation speed higher than the present rotation speed and performs a spin dry processing where a liquid component such as the rinsing liquid adhering to the wafer W is flicked off to dry the wafer W (step S7 in FIG. 6A: drying step). Further, the controller 6 controls the nitrogen gas valve 37 to discharge the nitrogen gas from the nitrogen gas nozzle 35 into the wet processing chamber 4. Drying of the rinsing liquid on the surface of the wafer W is facilitated by supplying the nitrogen gas into the wet processing chamber 4, and thus, drying time of the wafer W can be shortened.

In the drying step of step S7, a surface tension of the rinsing liquid remaining between adjacent cylinders 67 acts on the cylinders 67. It is considered that this surface tension becomes larger when a length of the cylinder 67 exposed from the sacrificial film 73 increases. Since the sacrificial film 73 is not entirely removed in the sacrificial film preetching step of step S5, the exposed length of the cylinder 67 can be made relatively small. Therefore, a collapse of the cylinder 67 in the drying step of step S7 can be suppressed or prevented.

After the drying step of step S7 is performed over a predetermined time, the controller 6 controls the electric motor 13 to stop the rotation of the wafer W.

After the rotation of the wafer W is stopped, the controller 6 controls the center robot CR to bring out from the wet processing chamber 4 the wafer W which is already subjected to the wet etching treatment (step S8 in FIG. 6B: wafer bringing-out).

The controller 6 controls the center robot CR to bring into the dry processing chamber 5 the wafer W which is already subjected to the wet etching treatment (step S9 in FIG. 6B: wafer bringing-in). The wafer W brought into the dry processing chamber 5 is held by the support member 44 while the surface which is subjected to the wet etching treatment faces upward.

After the wafer W is held by the support member 44, the controller 6 controls the rotary pump 61 and the turbo molecular pump 62 as well as the dry pump 56 (see FIG. 3) to drive both of the rotary pump 61 and the turbo molecular pump 62 in a state where drive of the dry pump 56 is stopped (step S10 in FIG. 6B: depressurizing step). Further, the controller 6 opens the vacuum valve 64 and controls the vacuum adjusting valve 65 to evacuate the dry processing chamber 5. Thus, the inside of the dry processing chamber 5 is depressurized to a predetermined air pressure.

After a predetermined time has passed from the drive of the rotary pump 61 and the turbo molecular pump 62, the controller 6 stops the drive of the rotary pump 61 and the turbo molecular pump 62. Further, the controller 6 stops the vacuum valve 64 and the vacuum adjusting valve 65 to stop the depressurizing of the dry processing chamber 5 by the rotary pump 61 and the turbo molecular pump 62.

After the rotary pump 61 and the turbo molecular pump 62 are stopped, the controller 6 controls the dry pump 56 as well as the rotary pump 61 and the turbo molecular pump 62 to drive the dry pump 56 in a state where the drive of the rotary pump 61 and the turbo molecular pump 62 is stopped. Further, the controller 6 opens the depressurizing adjusting valve 59. Thus, the inside of the dry processing chamber 5 is maintained in the depressurized state.

Figure 7E:
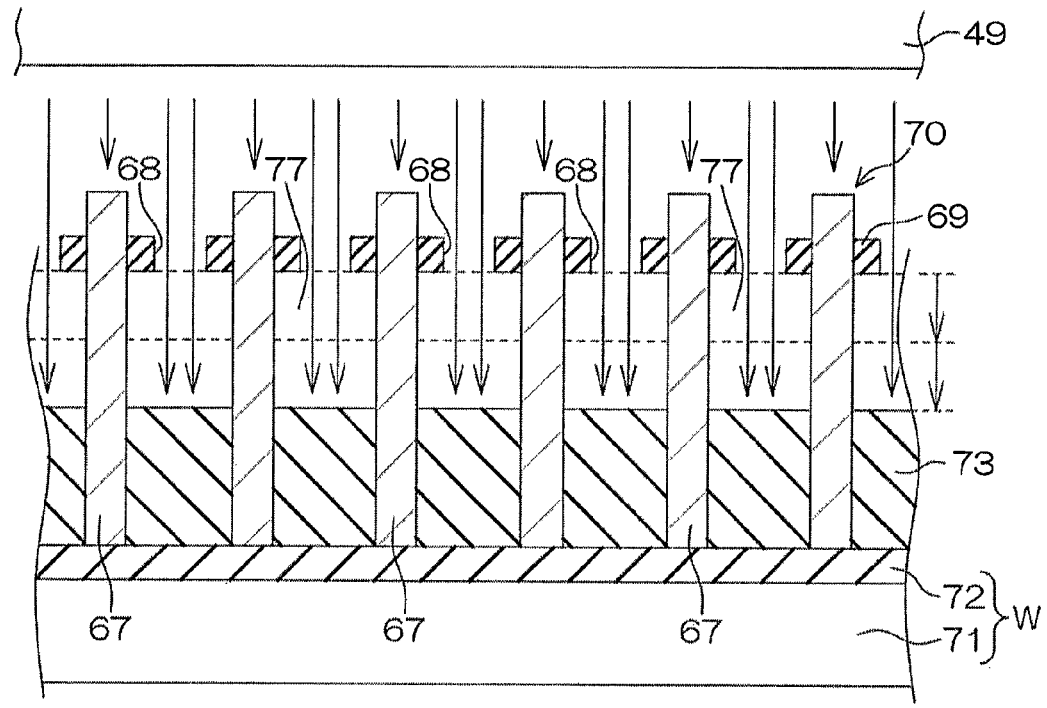
FIG. 7E is an illustrative view for explaining a process example of an etching treatment.

After a predetermined time has passed from the drive of the dry pump 56, the controller 6 opens the hydrogen fluoride valve 51 (see FIG. 3) (step S11 in FIG. 6B: dry etching step). When the hydrogen fluoride valve 51 is opened, the hydrogen fluoride supply source 53 is depressurized and hydrogen fluoride vaporizes, and at the same time, a hydrogen fluoride gas is supplied to the dry processing chamber 5 via the gas supply plate 49, as shown in FIG. 7E. Thus, the sacrificial film 73 embedded between the surface of the wafer W and the bridge 69 and not removed in the sacrificial film preetching step of step S5 is removed. Additionally, a gas flow rate of the hydrogen fluoride gas is adjusted by the hydrogen fluoride flow rate adjusting valve 52 according to need (for example, according to the film thickness of the sacrificial film 73 to be removed).

Figure 7F:
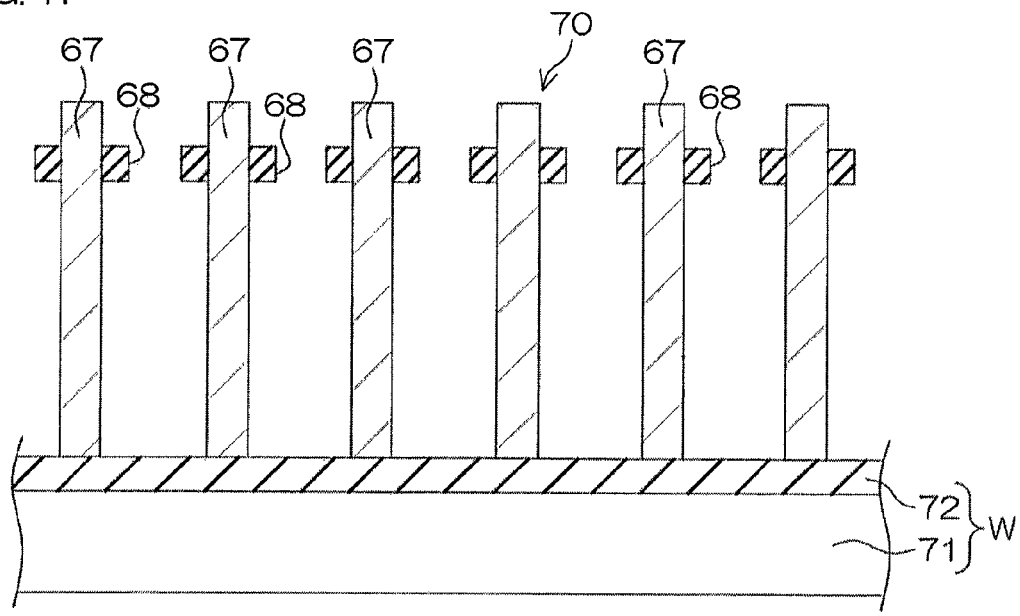
FIG. 7F is an illustrative view for explaining a process example of an etching treatment.

Further, at this time, since part of the sacrificial film 73 is removed in the sacrificial film preetching step of step S5, a space 77 having a predetermined thickness is formed between the sacrificial film 73 and the bridge 69 at the time of starting of the dry etching step of step S11. As shown by arrows in FIG. 7E, the hydrogen fluoride gas is spread in the space 77, whereby the hydrogen fluoride gas is evenly supplied to the sacrificial film 73 and the etching of the sacrificial film 73 is evenly progressed. As a result, as shown in FIG. 7F, the sacrificial film 73 can be evenly etched while the collapse of the cylinder 67 is suppressed or prevented.

When the wet etching is not performed before the dry etching step of step S11, etching of the sacrificial film 73 starts from a location exposed by the through hole 68. That is, etching may be uneven since the etching is started in a state where an entire surface of the sacrificial film 73 to be removed by etching is not exposed.

After a predetermined time of the dry etching step of step S11 has passed, the controller 6 closes the hydrogen fluoride valve 51 to stop the supply of hydrogen fluoride. Further, the controller 6 stops the drive of the dry pump 56 and closes the depressurizing adjusting valve 59 (step S12 in FIG. 6B: depressurizing releasing step). Thus, the inside of the dry processing chamber 5 is released from the depressurizing and returns to the air pressure.

After the depressurizing releasing step of step S12 is performed, the controller 6 controls the center robot CR to bring out from the dry processing chamber 5 the wafer W which is already subjected to the dry etching treatment (step S13 in FIG. 6B: wafer bringing-out). Further, the controller 6 controls the indexer robot IR to deliver this treated wafer W from the center robot CR to the indexer robot IR at a predetermined delivery position, and accommodates this treated wafer W in the carrier C.

As described above, according to this embodiment, in the sacrificial film preetching step of step S5, the sacrificial film 73 embedded between the plurality of cylinders 67 is not entirely removed but is removed to its halfway depth. The sacrificial film 73 not removed in the sacrificial film preetching step of step S5 is removed in the dry etching step of step S11 after the drying step of step S7.

A location where the surface tension of the rinsing liquid acts on each cylinder 67 in the drying step of step S7 is a portion of each cylinder 67 which is exposed from the sacrificial film 73. Since the sacrificial film 73 is removed to its halfway depth in the sacrificial film preetching step of step S5, the portion of each cylinder 67 which is exposed from the sacrificial film 73 is smaller than in a case where the entirety of the sacrificial film 73 is removed, and an influence of the surface tension of the rinsing liquid on each cylinder 67 can be made smaller. Thus, the collapse of the cylinder 67 can be suppressed or prevented in the drying step of step S7.

Further, the space 77 is formed between the bridge 69 and the sacrificial film 73 by performing the sacrificial film preetching step of step S5. As a result of the formation of the space 77, the hydrogen fluoride gas spread on the entire surface of the sacrificial film 73 to be etched with the start of the dry etching step of step S11, whereby the sacrificial film 73 can be evenly etched.

Further, according to a configuration of the substrate processing apparatus 1, the sacrificial film preetching step of step S5, the second rinse step of step S6 and the drying step of step S7 are performed in the wet processing unit 2, and the dry etching step of step S11 is performed in the dry processing unit 3. Thus, the etching treatments on a single wafer W can be favorably performed over the plurality of processing units 2, 3.

Figure 8:
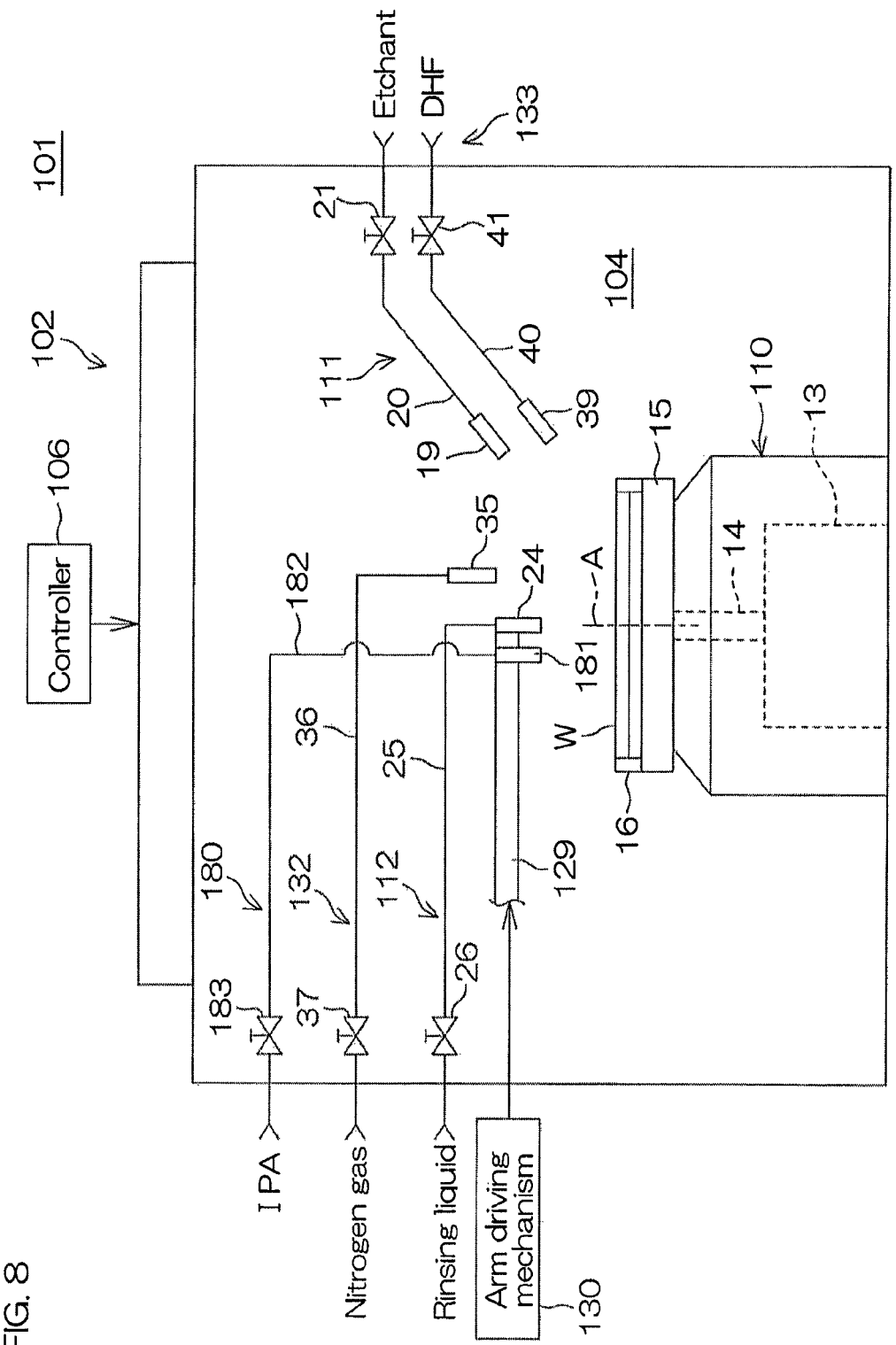
FIG. 8 is a schematic view of an inside of a wet processing unit of a substrate processing apparatus according to a second embodiment of the present invention viewed in the horizontal direction.

FIG. 8 is a schematic view of an inside of a wet processing unit 102 of a substrate processing apparatus 101 according to a second embodiment of the present invention viewed in the horizontal direction.

In a wet processing chamber 104 defined by partition walls, the wet processing unit 102 according to the substrate processing apparatus 101 includes a spin chuck 110 (substrate holding unit) for holding a wafer W, an etchant supply unit 111 for supplying an etchant to the wafer W held by the spin chuck 110, a rinsing liquid supply unit 112 for supplying a rinsing liquid to the wafer W held by the spin chuck 110, a nitrogen gas supply unit 132 for supplying a nitrogen gas into the wet processing chamber 104, and a DHF supply unit 133 for supplying DHF to a surface of the wafer W held by the spin chuck 110 to remove the natural oxide film 74.

The spin chuck 110, the etchant supply unit 111, the rinsing liquid supply unit 112, the nitrogen gas supply unit 132 and the DHF supply unit 133 of the wet processing unit 102 according to the second embodiment respectively have configurations similar to those of the spin chuck 10, the etchant supply unit 11, the rinsing liquid supply unit 12, the nitrogen gas supply unit 32 and the DHF supply unit 33 of the wet processing unit 2 according to the above-described first embodiment.

A nozzle arm 129 is attached to the etchant supply unit 111 according to the second embodiment. An arm driving mechanism 130 is connected to the nozzle arm 129, and the nozzle arm 129 is swung above the spin chuck 110 by transmitting a driving force of the arm driving mechanism 130 to the nozzle arm 129. The nozzle arm 129 and the arm driving mechanism 130 according to the second embodiment have configurations similar to those of the nozzle arm 29 and the arm driving mechanism 30 according to the above-described first embodiment. Therefore, in FIG. 8, the same reference symbols are used for equivalent configurations in FIG. 2 and descriptions thereof are omitted.

The wet processing unit 102 according to the second embodiment further includes an IPA supply unit 180 (low-surface-tension liquid supply unit) for supplying IPA (Isopropyl alcohol) of a liquid as a low-surface-tension liquid having a surface tension smaller than that of the above-described rinsing liquid to the surface of the wafer W.

The IPA supply unit 180 includes an IPA nozzle 181. The IPA nozzle 181 is configured by a straight nozzle discharging a liquid in a state of a continuous flow. An IPA piping 182 to which IPA is supplied from an IPA supply source is connected to the IPA nozzle 181. An IPA valve 183 for opening and closing the IPA piping 182 is interposed in the IPA piping 182. When the IPA valve 183 is opened, IPA is supplied from the IPA piping 182 to the IPA nozzle 181, and when the IPA valve 183 is closed, the supply of IPA from the IPA piping 182 to the IPA nozzle 181 is stopped.

Like the above-described rinsing liquid nozzle 24, the IPA nozzle 181 is attached to the nozzle arm 129. That is, the IPA nozzle 181 is a so-called scan nozzle in which a liquid contact position of IPA on the surface of the wafer W is scanned by swinging of the nozzle arm 129.

The indexer robot IR, the center robot CR, the electric motor 13, the arm driving mechanism 130, the etchant valve 21, the rinsing liquid valve 26, the nitrogen gas valve 37, the DHF valve 41, the hydrogen fluoride valve 51, the hydrogen fluoride flow rate adjusting valve 52, the dry pump 56, the depressurizing valve 58, the depressurizing adjusting valve 59, the rotary pump 61, the turbo molecular pump 62, the vacuum valve 64, the vacuum adjusting valve 65, the IPA valve 183 and the like are connected to a control device 106 as objects to be controlled.

Figure 9:
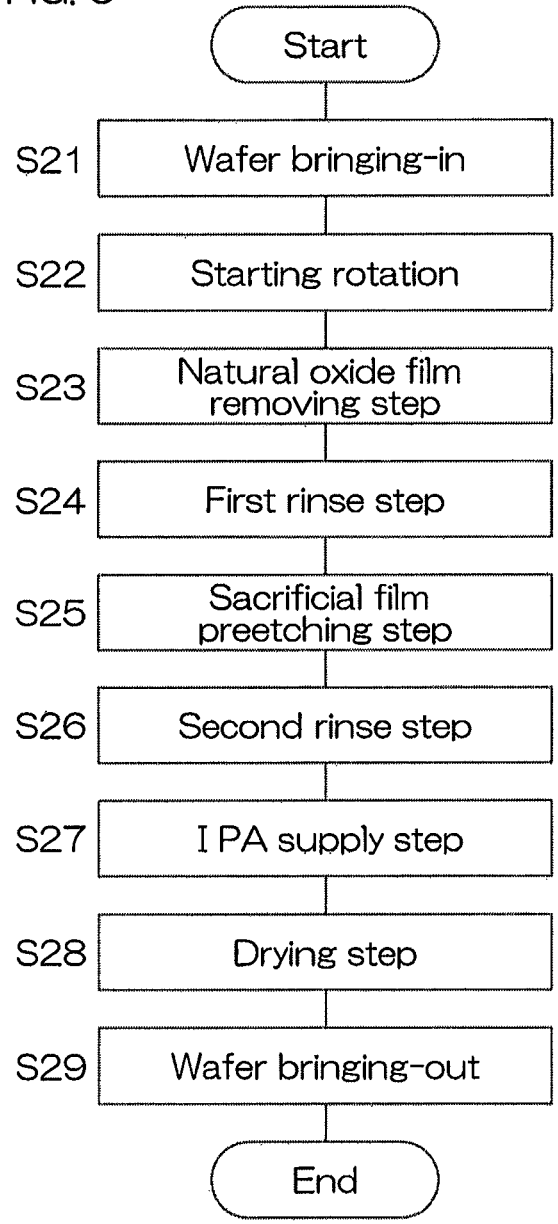
FIG. 9 is a flow chart showing a process example of an etching treatment in the wet processing unit shown in FIG. 8.

FIG. 9 is a flow chart showing a process example of a wet etching treatment by the wet processing unit 102 shown in FIG. 8.

In the wet etching treatment by the wet processing unit 102 according to the second embodiment, wafer bringing-in of step S21 where the wafer W is brought into the wet processing chamber 104, a natural oxide film removing step (preprocessing step) of step S23 where DHF is supplied to the surface of the wafer W after rotation of the wafer W is started in step S22, a first rinse step of step S24 where the rinsing liquid is supplied to the surface of the wafer W, a sacrificial film preetching step (wet etching step) of step S25 where the etchant is supplied to the surface of the wafer W to remove part of the sacrificial film 73, a second rinse step of step S26 where the rinsing liquid is supplied to the surface of the wafer W, an IPA supply step (low-surface-tension liquid displacing step) of step S27 where IPA is supplied to the surface of the wafer W, a drying step of step S28 where the wafer W is dried, and wafer bringing-out of step S29 where the treated wafer W is brought out from the wet processing chamber 104 are performed in order.

The wafer bringing-in of step S21 is similar to the wafer bringing-in of step S1 in the above-described first embodiment. The starting rotation of step S22 is similar to the starting rotation of step S2 in the above-described first embodiment. The natural oxide film removing step of step S23 is similar to the natural oxide film removing step of step S3 in the above-described first embodiment. The first rinse step of step S24 is similar to the first rinse step of step S4 in the above-described first embodiment. The sacrificial film preetching step of step S25 is similar to the sacrificial film preetching step of step S5 in the above-described first embodiment except that the sacrificial film 73 is etched relatively more deeply than in the above-described first embodiment. The second rinse step of step S26 is similar to the second rinse step of step S6 in the above-described first embodiment. The drying step of step S28 is similar to the drying step of step S7 in the above-described first embodiment. The wafer bringing-out of step S29 is similar to the wafer bringing-out of step S8 in the above-described first embodiment. Differences from the wet etching treatment according to the above-described first embodiment are described below.

Figures 10, 11:
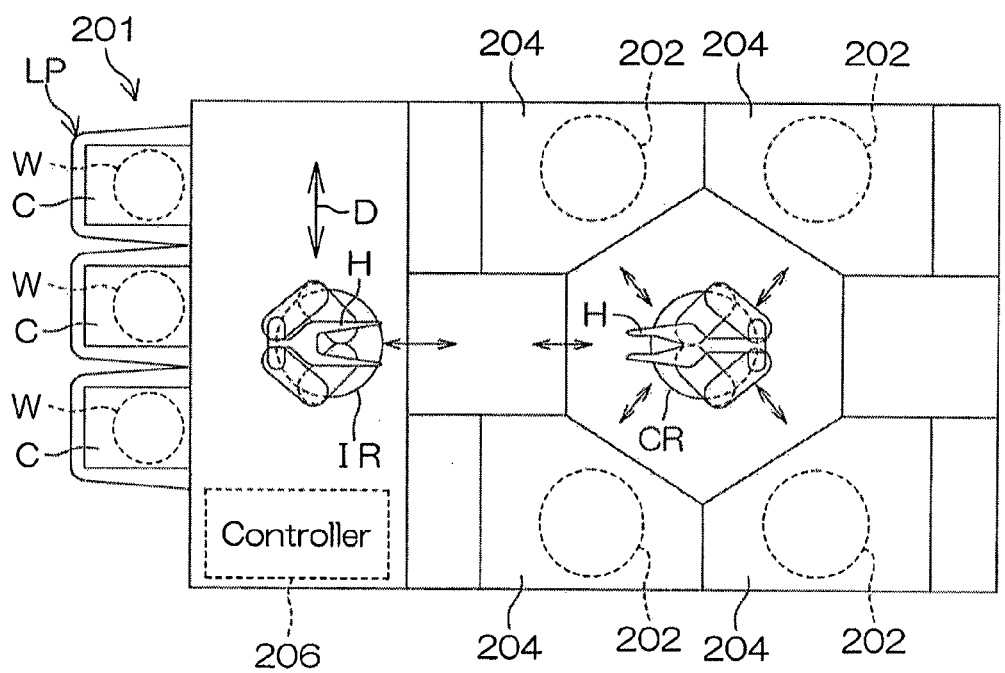
FIG. 10 is a table for comparing etching amounts of a sacrificial film.
FIG. 11 is a schematic plan view of an outline configuration of a substrate processing apparatus according to a third embodiment of the present invention.

Unlike the above-described first embodiment, in the second embodiment, the IPA supply step of step S27 (described below) is performed after the second rinse step of step S26 to displace the rinsing liquid on the wafer W surface with IPA which is a low-surface-tension liquid. Thus, an influence of the surface tension of the rinsing liquid on the pattern 70 at the time of the drying step of step S28 can be made smaller than in the first embodiment not having the IPA supply step. Thus, when the sacrificial film 73 is etched in the sacrificial film preetching step of step S25 of the second embodiment deeper than in the sacrificial film preetching step of step S5 of the first embodiment, the collapse of the cylinder 67 does not occur in the drying step of step S28. FIG. 10 shows an aspect ratio (AR) of the sacrificial film 73 after the etching at this time in comparison to the aspect ratio (AR) of the sacrificial film 73 after the etching in the above-described first embodiment. Additionally, the aspect ratio (AR) of the sacrificial film 73 after the etching is defined by a value obtained through dividing the height of the portion of the cylinder 67 exposed from the sacrificial film 73 by the sum of the distance L1 (see FIG. 4B) between cylinders 67 adjacent to each other and the width L2 of the cylinder 67.

That is, the Inventors have confirmed that in the sacrificial film preetching step of step S5 of the first embodiment, the collapse of the cylinder 67 does not occur at the time of performing the drying step of step S7 even when the sacrificial film 73 is etched until the aspect ratio (AR) of the cylinder 67 after the etching becomes around 8. On the other hand, the Inventors have confirmed that in the sacrificial film preetching step of step S25 of the second embodiment, the collapse of the cylinder 67 does not occur at the time of performing the drying step of step S28 even when the sacrificial film 73 is etched until the aspect ratio (AR) of the cylinder 67 after the etching becomes around 15.

Thus, in the sacrificial film preetching step of step S25 of the second embodiment, the sacrificial film 73 is etched relatively deeply.

After the sacrificial film preetching step of step S25 is performed, the IPA supply step of step S27 is performed following the second rinse step of step S26.

In the IPA supply step of step S27, the control device 106 opens the IPA valve 183 to discharge IPA from the IPA nozzle 181 to the surface of the wafer W. Further, the control device 106 controls the arm driving mechanism 130 to swing the nozzle arm 129 from the surface peripheral portion of the wafer W to the surface center portion of the wafer W, for example. Thus, the IPA nozzle 181 is moved from the surface peripheral portion of the wafer W to the surface center portion of the wafer W. Further, a supply position on the surface of the wafer W to which IPA from the IPA nozzle 181 is guided moves in a range from the surface peripheral portion of the wafer W to the surface center portion of the wafer W in an arc-shaped trajectory intersecting the rotating direction of the wafer W. Thus, IPA reaches the whole area of the surface of the wafer W to displace the rinsing liquid present between the surface of the sacrificial film 73 and the bridge 69 with IPA.

As described above, according to the process example of the second embodiment, in the IPA supply step of step S27, the rinsing liquid present between the surface of the sacrificial film 73 and the bridge 69 is displaced with IPA. Therefore, a surface tension acting on a portion of each cylinder 67 which is exposed from the sacrificial film 73 becomes lower. As a result, even when the portion of each cylinder 67 which is exposed from the sacrificial film 73 is large, the collapse of each cylinder 67 can be suppressed or prevented in the drying step of step S28. Thus, even when the sacrificial film 73 is removed to a deep position in the sacrificial film preetching step of step S25, the collapse of each cylinder 67 can be prevented in the drying step of step S28.

In the second embodiment, since an etching amount in the sacrificial film preetching step of step S25 is larger than in the first embodiment, an etching amount to be removed in the dry etching step of step S11 of the second embodiment is smaller than in the first embodiment. Since an etching efficiency of a wet etching is generally higher than that of a dry etching, a time required for etching removal of the whole sacrificial film 73 is shorter in the second embodiment than in the first embodiment. Thus, in the second embodiment, a whole processing time can be shortened while the collapse of the cylinder 67 can be suppressed or prevented.

Figure 12:
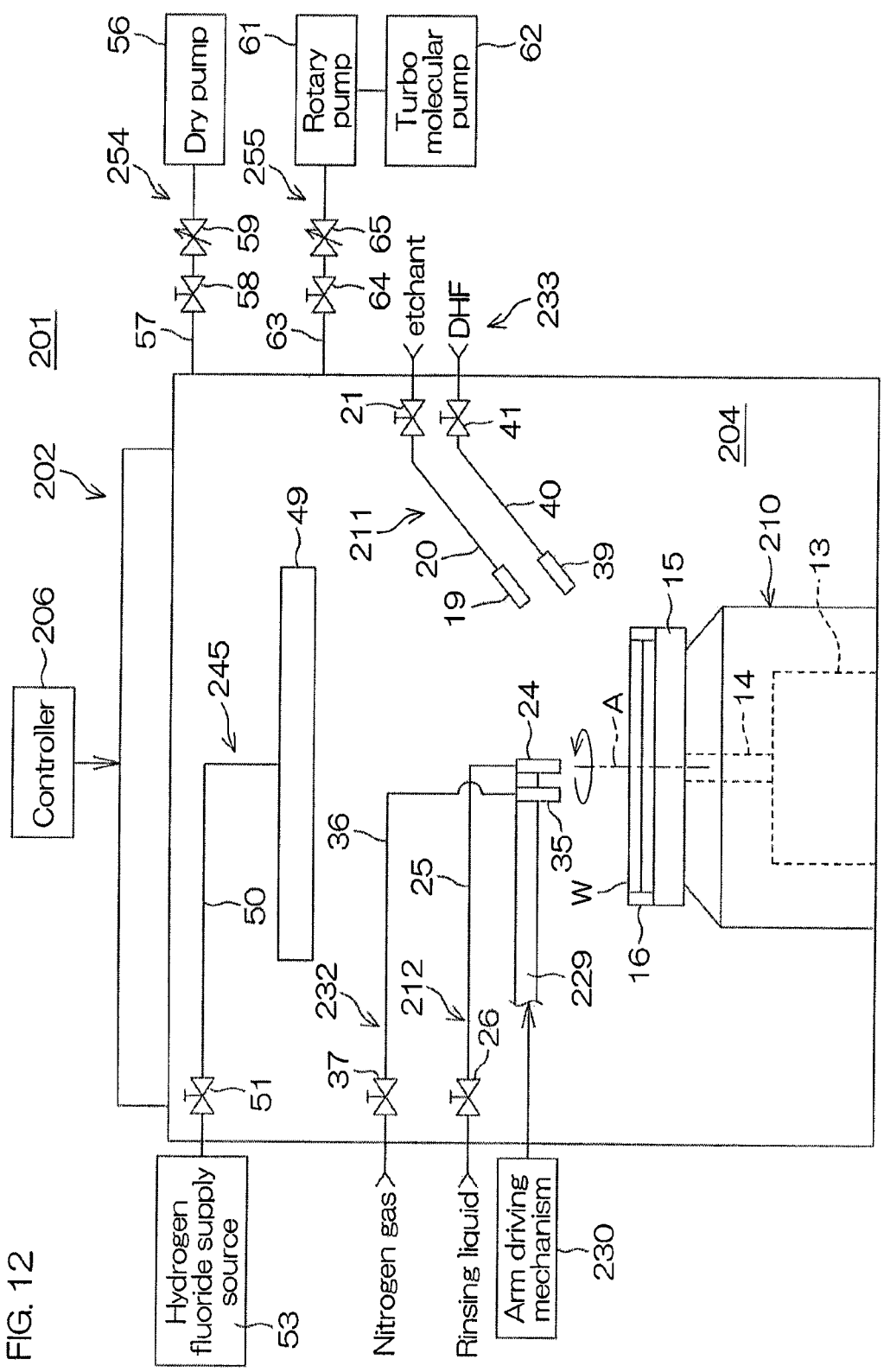
FIG. 12 is a schematic view of an inside of a processing unit in FIG. 11 viewed in the horizontal direction.

FIG. 11 is a schematic plan view of an outline configuration of a substrate processing apparatus 201 according to a third embodiment of the present invention. FIG. 12 is a schematic view of an inside of a processing unit 202 in FIG. 11 viewed in the horizontal direction.

The substrate processing apparatus 201 according to the third embodiment is different from the substrate processing apparatus 1 according to the above-described first embodiment in that the substrate processing apparatus 201 includes the processing unit 202 for performing a wet etching treatment using an etchant to a wafer W and a dry etching treatment using an etching gas to the wafer W, and that the substrate processing apparatus 201 includes the processing unit 202, the indexer robot IR, the center robot CR, and a control device 206 controlling movement of devices and opening and closing of valves provided in the substrate processing apparatus 201. Other configurations are similar to those in the substrate processing apparatus 1 according to the above-described first embodiment. Therefore, in FIGS. 11 and 12, the same reference symbols are used for portions corresponding to the respective portions shown in above-described FIGS. 11 and 12 and descriptions thereof are omitted.

In a wet processing chamber 204 defined by partition walls, the wet processing unit 202 includes a spin chuck 210 (substrate holding unit) for holding the wafer W, an etchant supply unit 211 (etchant supply unit) for supplying an etchant to the wafer W held by the spin chuck 210, and a rinsing liquid supply unit 212 (rinsing liquid supply unit) for supplying a rinsing liquid to the wafer W held by the spin chuck 210, a nitrogen gas supply unit 232 for supplying a nitrogen gas into the wet processing chamber 204, and a DHF supply unit 233 for supplying DHF to remove a natural oxide film 74 of the wafer W held by the spin chuck 210.

The spin chuck 210, the etchant supply unit 211, the rinsing liquid supply unit 212, the nitrogen gas supply unit 232 and the DHF supply unit 233 of the processing unit 202 according to the third embodiment have configurations similar to those of the spin chuck 10, the etchant supply unit 11, the rinsing liquid supply unit 12, the nitrogen gas supply unit 32 and the DHF supply unit 33 of the processing unit 2 according to the above-described first embodiment.

A nozzle arm 229 is attached to the rinsing liquid nozzle 212 and the nitrogen gas supply unit 232 according to the third embodiment. An arm driving mechanism 230 is connected to the nozzle arm 229, and the nozzle arm 229 is swung above the spin chuck 210 by transmitting a driving force of the arm driving mechanism 230 to the nozzle arm 229. The nozzle arm 229 and the arm driving mechanism 230 according to the third embodiment have configurations similar to those of the nozzle arm 29 and the arm driving mechanism 30 according to the above-described first embodiment.

The wet processing unit 202 further includes an etching gas supply unit 245 (etching gas supply unit) for supplying an etching gas into the processing chamber 204 defined by the partition walls, and a first depressurizing unit 254 and a second depressurizing unit 255 for depressurizing the processing chamber 204.

The etching gas supply unit 245, the first depressurizing unit 254 and the second depressurizing unit 255 of the processing unit 202 according to the third embodiment have configurations similar to those of the etching gas supply unit 45, the first depressurizing unit 54 and the second depressurizing unit 55 of the dry processing unit 3 according to the above-described first embodiment.

The indexer robot IR, the center robot CR, the electric motor 13, the arm driving mechanism 230, the etchant valve 21, the rinsing liquid valve 26, the nitrogen gas valve 37, the DHF valve 41, the hydrogen fluoride valve 51, the hydrogen fluoride flow rate adjusting valve 52, the dry pump 56, the depressurizing valve 58, the depressurizing adjusting valve 59, the turbo molecular pump 62, the rotary pump 61, the vacuum valve 64, the vacuum adjusting valve 65 and the like are connected to the control device 206 as objects to be controlled.

Figure 13:
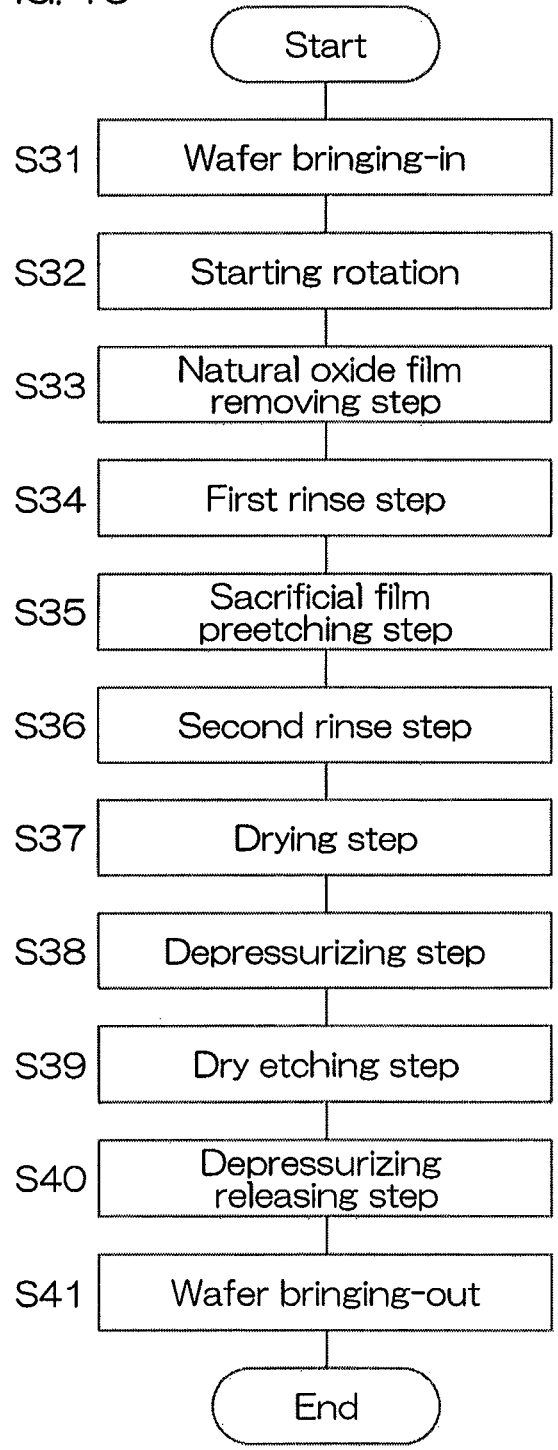
FIG. 13 is a flow chart showing a process example of an etching treatment in the processing unit shown in FIG. 12.

FIG. 13 is a flow chart showing a process example of an etching treatment in the processing unit 202 shown in FIG. 12.

The processing unit 202 according to the third embodiment sequentially performs wafer bringing-in of step S31 where the wafer W is brought into the processing chamber 204, a natural oxide film removing step (preprocessing step) of step S33 where DHF is supplied to the surface of the wafer W after rotation of the wafer W is started in step S32, a first rinse step of step S34 where the rinsing liquid is supplied to the surface of the wafer W, a sacrificial film preetching step (wet etching step) of step S35 where the etchant is supplied to the surface of the wafer W to remove part of the sacrificial film 73, a second rinse step (rinse step) of step S63 where the rinsing liquid is supplied to the surface of the wafer W, a drying step (drying step) of step S37 where the wafer W is dried, a depressurizing step of step S38 where an inside of the processing chamber 204 is depressurized, a dry etching step of step S39 where the etching gas is supplied into the processing chamber 204, a depressurizing releasing step of step S40 where a pressure of the inside of the processing chamber 204 is returned to a normal pressure, and wafer bringing-out of step S41 where the wafer W that has been subjected to the dry etching treatment is brought out from the dry processing chamber 5.

The wafer bringing-in of step S31 is similar to the wafer bringing-in of step S1 in the above-described first embodiment. The starting rotation of step S32 is similar to the starting rotation of step S2 in the above-described first embodiment. The natural oxide film removing step of step S33 is similar to the natural oxide film removing step of step S3 in the above-described first embodiment. The first rinse step of step S34 is similar to the first rinse step of step S4 in the above-described first embodiment. The sacrificial film preetching step of step S35 is similar to the sacrificial film preetching step of step S5 in the above-described first embodiment. The second rinse step of step S36 is similar to the second rinse step of step S6 in the above-described first embodiment. The drying step of step S37 is similar to the drying step of step S7 in the above-described first embodiment. The depressurizing step of step S38 is similar to the depressurizing step of step S10 in the above-described first embodiment. The dry etching step of step S39 is similar to the dry etching step of step S11 in the above-described first embodiment. The depressurizing releasing step of step S40 is similar to the depressurizing releasing step of step S12 in the above-described first embodiment. The wafer bringing-out of step S41 is similar to the wafer bringing-out of step S13 in the above-described first embodiment. Differences from the wet etching treatment and the dry etching treatment according to the above-described first embodiment are described below.

Different from the above-described first embodiment, in the etching treatment according to the third embodiment, after the wet etching treatment is performed, the dry etching treatment is performed continuously in the same processing unit 202. That is, after the drying step of step S37 is performed, the control unit 206 controls the rotary pump 61 and the turbo molecular pump 62 as well as the dry pump 56 to perform the depressurizing step of step S38. Thereafter, the control unit 206 sequentially performs steps 39 to 41.

As described above, according to this configuration, the steps from the wafer bringing-in of step S31 to the wafer bringing-out of step S41 can be continuously performed to one wafer W. Thus, the etching treatments to one wafer W can be performed in a relatively short time.

While the embodiments of the present invention are described above, the present invention can be implemented in yet other modes.

For example, with respect to the above-described respective embodiments, the examples of the substrate processing apparatuses 1, 101, 201 totally including the four processing units 2, 3, 102, 202 are described. However, a substrate processing apparatus totally including four or more processing units 2, 3, 102, 202 may be employed.

Further, with respect to the above-described respective embodiments, the examples of the substrate processing apparatuses 1, 101, 201 including the processing units 2, 3, 102, 202 in the same layer are described. However, a substrate processing apparatus where a plurality of processing units 2, 3, 102, 202 are disposed in a stacked manner may be employed. In this case, the example of a substrate processing apparatus 301 shown in FIG. 14 may be employed.

Figure 14:
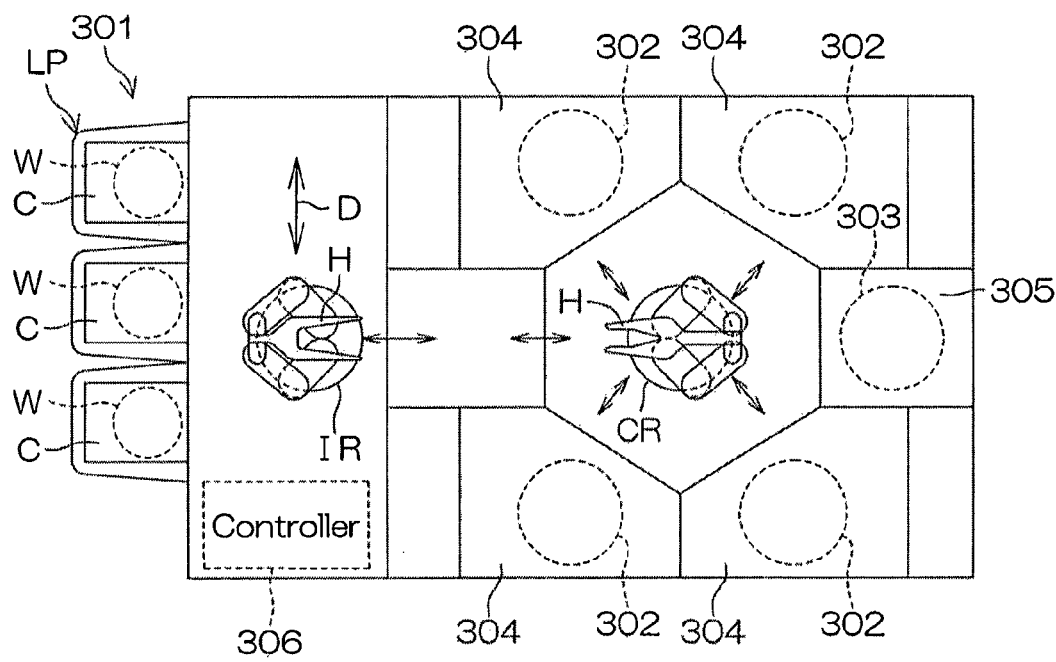
FIG. 14 is a schematic plan view of a substrate processing apparatus according to a modification of the present invention.
Figure 15:
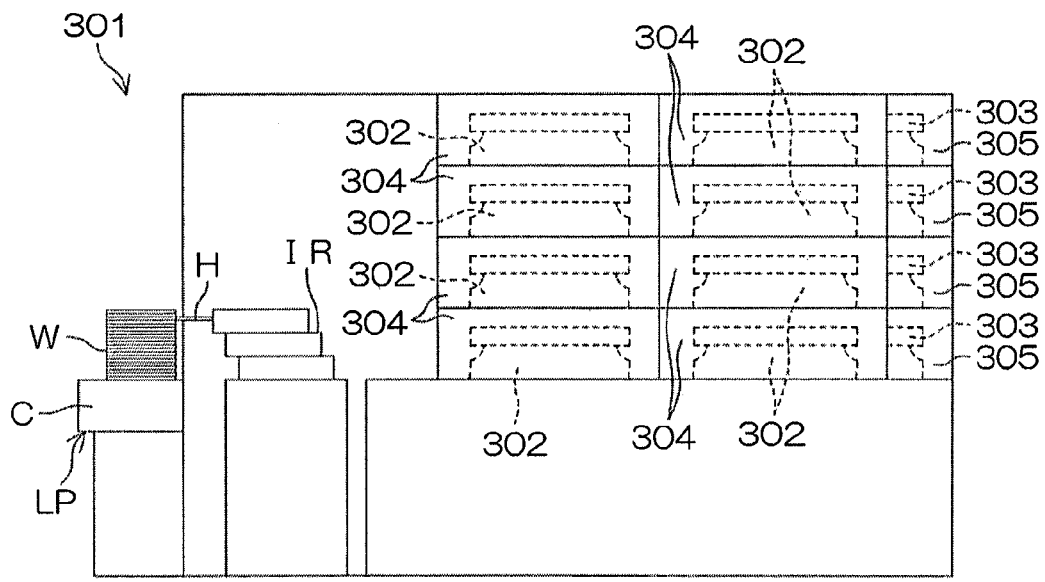
FIG. 15 is a schematic view of the substrate processing apparatus in FIG. 14 viewed in the horizontal direction.

FIG. 14 is a schematic plan view of the substrate processing apparatus 301 according to a modification of the present invention. FIG. 15 is a schematic view of the substrate processing apparatus 301 in FIG. 14 viewed in the horizontal direction. In FIGS. 14 and 15, the same reference symbols are used for portions corresponding to the respective portions shown in above-described FIG. 1 and descriptions thereof are omitted.

The substrate processing apparatus 301 includes a plurality of wet processing units 302 (in this modification, 16) and a plurality of dry processing units 303 (in this modification, four) arranged in a manner to surround the center robot CR. The wet processing units 302 and the dry processing units 303 are respectively stacked in four stages around the center robot CR.

A wet processing units 302 is disposed in a dry processing chamber 304. Four wet processing units 302 are arranged in one layer to surround the center robot CR and are stacked in a state where two wet processing units 302 are adjacent to each other. On the other hand, a dry processing unit 303 is arranged in a wet processing chamber 305. The dry processing units 303 are arranged in a stacked manner at a position opposite to the indexer robot IR with the center robot CR sandwiched. The wet processing units 302 and the dry processing units 303 according to the modification have configurations similar to the wet processing unit 2 (see FIG. 2) and the dry processing unit 3 (see FIG. 3) according to the above-described first embodiment.

The center robot CR comprises in its inside an up-and-down driving mechanism (not shown) for moving the hand H up and down, and thus, can bring the wafer W received from the indexer robot IR into the wet processing units 302 and the dry processing units 303 arranged in each layer. Further, the center robot CR can bring out the processed wafer W from the wet processing units 302 and the dry processing units 303 arranged in each layer.

The substrate processing apparatus 301 includes the wet processing units 302 and the dry processing units 303, the indexer robot IR, the center robot CR, and a control device 306 controlling movement of devices and opening and closing of a valve provided in the substrate processing apparatus 301.

Even such a configuration can have advantages similar to the advantages described in the above respective embodiments. Further, the substrate processing apparatus 301 includes the plurality of wet processing units 302 and dry processing units 303, and thus, can efficiently perform the etching treatments to a plurality of wafers W.

Further, in the above-described respective embodiments, the wet etching treatment and the dry etching treatment are performed to the wafer W in which the bridge 69 is formed on the surface of the sacrificial film 73. However, based on the present invention, the wet etching treatment and the dry etching treatment can be performed to a wafer W in which the bridge 69 is not formed on the surface of the sacrificial film 73. In this case, the natural oxide film removing step of step S3, S23, S33 and the first rinse step of step S4, S24, S34 in the first, second and third embodiments are not performed. However, the cylinder 67 becomes easy to collapse when the bridge 69 is not formed. Therefore, it is desirable that the etching amount in the sacrificial film preetching step of step S5, S25, S35 is made smaller than in a case where the wafer W provided with the bridge 69 is etched.

Further, in the sacrificial film preetching step of step S5, S25, S35 of the above-described respective embodiments, when DHF is used as the etchant supplied from the etchant nozzle 19 to the surface of the wafer W, the etchant nozzle 19 can be also used as the DHF nozzle 39. Therefore, in this case, the wet processing unit 2, 102 and the processing unit 202 may comprise only either of the DHF supply unit 33, 133, 233 or the etchant supply unit 11, 111, 211.

Further, in the above-described third embodiment, the processing unit 202 may include an IPA supply unit having a configuration similar to that of the IPA supply unit 180 according to the above-described second embodiment. In this case, an IPA supply step similar to the IPA supply step of step S27 of the above-described second embodiment may be added after performing the second rinse step of step S36 and prior to the drying step of step S37 in the flow chart of FIG. 13.

In this case, the sacrificial film 73 can be etched in the sacrificial film preetching step of step S35 deeper than in the case where only the rinsing liquid is supplied to the surface of the wafer W in the second rinse step of step S36, as shown in FIG. 10. Thus, a whole processing time can be shortened while the collapse of the cylinder 67 can be suppressed or prevented.

Further, while the hydrogen fluoride gas is shown as an example of the etching gas used in the dry etching step of step S11, S39, it is not limited to this, and fluorine, chlorine trifluoride, iodine heptafluoride, mixed gas thereof, and the like can be also used.

A structure of the wafer W surface targeted by the present invention is not limited to the one described using FIGS. 4A and 4B. For example, the present invention can be also applied to a wafer W where the bridge 69 supporting the plurality of cylinders 67 and the etching stopper layer 72 are not formed.

While the embodiments of the present invention are described in detail, these are only specific examples used for clarifying technical contents of the present invention, and the present invention should not be construed as being limited to these specific examples, but is only limited by the scope of the appended claims.

This application corresponds to Japanese Patent Application No. 2013-225859 filed in Japan Patent Office on Oct. 30, 2013, the entire disclosure of which is incorporated herein by reference.

DESCRIPTION OF SYMBOLS 1 substrate processing apparatus (substrate processing apparatus)
2 wet processing unit (wet processing chamber)
3 dry processing unit (dry processing chamber)
6 controller (control unit)
10 spin chuck (substrate holding unit)
11 etchant supply unit (etchant supply unit)
12 rinsing liquid supply unit (rinsing liquid supply unit)
13 electric motor (substrate rotating unit)
33 DHF supply unit (etchant supply unit)
44 support member (substrate holding unit)
45 gas supply unit (etching gas supply unit)
67 cylinder (strut)
68 through hole (hole portion)
69 bridge (supporting film)
73 sacrificial film (sacrificial film)
74 natural oxide film (natural oxide film)
101 substrate processing apparatus
102 wet processing unit
106 controller
110 spin chuck
111 etchant supply unit
112 rinsing liquid supply unit
113 DHF supply unit
180 IPA supply unit (low-surface-tension liquid supply unit)
201 substrate processing apparatus
202 processing unit (processing chamber)
206 controller
210 spin chuck
211 etchant supply unit
212 rinsing liquid supply unit
233 DHF supply unit
245 gas supply unit
301 substrate processing apparatus
302 wet processing unit
303 dry processing unit
306 controller
W wafer

What is claimed is:

1. A sacrificial-film removal method of removing a sacrificial film from a surface of a substrate provided with a plurality of struts, the sacrificial film being embedded between the plurality of struts, wherein a natural oxide film and a supporting film support the plurality of struts and have a plurality of hole portions, the method including:

a wet etching step where the sacrificial film is removed to its halfway depth by supplying an etchant to the surface of the substrate;

a rinse step where a residue adhering to the surface of the substrate is washed out by supplying a rinsing liquid to the surface of the substrate after the wet etching step;

a drying step where a liquid component on the surface of the substrate is removed after the rinse step;

a dry etching step where the sacrificial film remaining on the surface of the substrate is removed by supplying an etching gas to the surface of the substrate after the drying step, and a preprocessing step where the natural oxide film formed on the surface of the supporting film is removed prior to the wet etching step, wherein removal by the etchant is started from portions of the sacrificial film corresponding to the plurality of hole portions in the wet etching step.

2. The sacrificial-film removal method according to claim 1, further including a low-surface-tension liquid displacing step where the rinsing liquid on the surface of the substrate is displaced with a low-surface-tension liquid whose surface tension is lower than that of the rinsing liquid by supplying the low-surface-tension liquid to the surface of the substrate after the rinse step and prior to the drying step.

3. A sacrificial-film removal method of removing a sacrificial film from a surface of a substrate provided with a plurality of struts, the sacrificial film being embedded between the plurality of struts, wherein a supporting film supports the plurality of struts and has a plurality of hole portions, the supporting film being disposed only on the side opposite to the substrate with respect to the sacrificial film, the method including:

a wet etching step where the sacrificial film is removed to its halfway depth by supplying an etchant to the surface of the substrate;

a rinse step where a residue adhering to the surface of the substrate is washed out by supplying a rinsing liquid to the surface of the substrate after the wet etching step;

a drying step where a liquid component on the surface of the substrate is removed after the rinse step; and a dry etching step where the sacrificial film remaining on the surface of the substrate is removed by supplying an etching gas to the surface of the substrate after the drying step, wherein removal by the etchant is started from portions of the sacrificial film corresponding to the plurality of hole portions in the wet etching step.

4. The sacrificial-film removal method according to claim 3, further including a low-surface-tension liquid displacing step where the rinsing liquid on the surface of the substrate is displaced with a low-surface-tension liquid whose surface tension is lower than that of the rinsing liquid by supplying the low-surface-tension liquid to the surface of the substrate after the rinse step and prior to the drying step.

* * * * *